United States Patent [19]

Aoai et al.

[11] Patent Number: 5,837,420
[45] Date of Patent: Nov. 17, 1998

[54] POSITIVE WORKING PHOTOSENSITIVE COMPOSITION

[75] Inventors: Toshiaki Aoai; Kunihiko Kodama; Kazuya Uenishi; Tsukasa Yamanaka, all of Shizuoka, Japan

[73] Assignee: Fuji Photo Film Co., Ltd., Kanagawa, Japan

[21] Appl. No.: 812,165

[22] Filed: Mar. 6, 1997

[30] Foreign Application Priority Data

Mar. 8, 1996 [JP] Japan ................................. 8-052006

[51] Int. Cl.[6] ................................................ G03C 1/492
[52] U.S. Cl. ...................... 430/270.1; 430/914; 430/921; 522/31
[58] Field of Search ................................ 430/270.1, 914, 430/921; 522/31

[56] References Cited

U.S. PATENT DOCUMENTS

| | | | |
|---|---|---|---|
| 5,347,040 | 9/1994 | Reiser et al. | 560/139 |
| 5,569,784 | 10/1996 | Watanabe et al. | 564/430 |
| 5,580,695 | 12/1996 | Murata et al. | 430/270.1 |

Primary Examiner—M. Nuzzolillo
Assistant Examiner—Steven H. VerSteeg
Attorney, Agent, or Firm—Sughrue, Mion, Zinn, Macpeak & Seas, PLLC

[57] ABSTRACT

A positive working photosensitive composition is disclosed, which comprises (a) a resin having groups capable of increasing solubility of the resin in an alkali developer through their decomposition due to the action of an acid and (b) a compound represented by formula (I) or (II) generating sulfonic acid by irradiation with active rays or radiant rays:

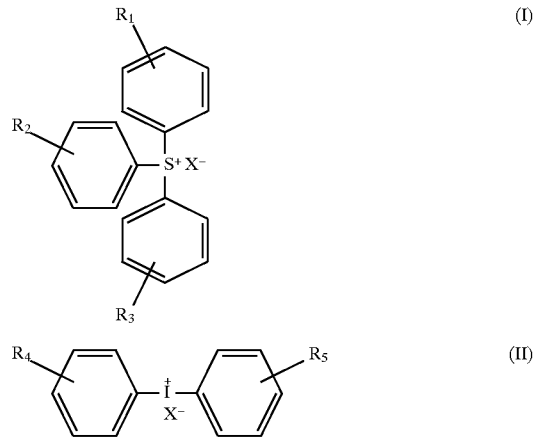

5 Claims, No Drawings

POSITIVE WORKING PHOTOSENSITIVE COMPOSITION

FIELD OF THE INVENTION

The present invention relates to a positive working photosensitive composition used in the manufacturing process of a lithographic printing plate or a semiconductor device such as IC, in the production of a circuit substrate for liquid crystal, a thermal head or the like, and in other photofabrication processes.

BACKGROUND OF THE INVENTION

In general, a composition of the type which comprises an alkali-soluble resin and a naphthoquinonediazide compound as photosensitive material has been used as positive photoresist composition. For instance, the combinations of novolak-type phenol resins with naphthoquinonediazido-substituted compounds are disclosed as compositions of the aforesaid type, e.g., in U.S. Pat. Nos. 3,666,473, 4,115,128 and 4,173,470, and the combinations of novolak resins prepared from cresols and formaldehyde with trihydroxybenzophenone-1,2-naphthoquinonediazide sulfonic acid esters are described as most typical compositions in L. F. Thompson, *Introduction to Microlithography*, No. 219, pp. 112–121, ACS publisher.

The positive photoresist as described above is basically constituted of a novolak resin and a quinonediazide compound. The novolak resin as one constituent thereof can provide high resistance to plasma etching and the naphthoquinonediazide compound as the other constituent functions as a dissolution inhibitor. Further, the naphthoquinonediazide has a characteristic of generating a carboxylic acid upon irradiation with light to lose the ability for inhibiting dissolution, thereby heightening the solubility of a novolak resin in alkali.

From the aforementioned points of view, a large number of positive photoresist compositions which each comprise a novolak resin and a naphthoquinonediazide type photosensitive material have hitherto been developed and put to practical use. In the processing of lines having a width of the order of 0.8–2 μm, those compositions have accomplished satisfactory results.

On the other hand, the integration degree of an integrated circuit has become higher and higher in recent years, so that the art of micro-lithography for processing super fine patterns having a line width of half micron or below has come to be required in the production of semiconductor substrates for VLSI and the like. In order to achieve the resolution required therein, the wavelengths used in an exposure apparatus for photolithography were getting shorter, and nowadays the utilization of far ultraviolet light and excimer laser beams (XeCl, KrF, ArF) is being examined.

In a case where a conventional resist comprising a novolak resin and a naphthoquinonediazide compound is used for forming patterns by the lithography using far ultraviolet light or an excimer laser beam, it is difficult for the light to reach the lower part of the resist because a novolak resin and naphthoquinonediazide have strong absorption in the far ultraviolet region, so that such a resist has low sensitivity and can merely provide a pattern profile having a tapered shape.

As one means to solve the aforementioned problems, the chemically amplified resist compositions disclosed, e.g., in U.S. Pat. No, 4,491,628 and European Patent 0,249,139 can be used. The chemically amplified positive resist compositions refer to the pattern forming materials of the type which generate acids in the irradiated area upon irradiation with radiation, such as far ultraviolet light, to cause a reaction utilizing these acids as catalyst, thereby making a difference of solubility in a developer between the irradiated and unirradiated areas with the active radiation. By virtue of this solubility difference, a pattern can be formed on a substrate coated with a material of the foregoing type.

As examples of a chemically amplified resist composition, mention may be made of the combination of a compound capable of generating an acid by photolysis (which is called a photoacid generator, hereinafter) with acetal or an O, N-acetal compound (JP-A-48-89003, wherein the term "JP-A" means an unexamined published "Japanese patent application"), the combination of a photoacid generator with an orthoester or amidoacetal compound (JP-A-51-120714), the combination of a photoacid generator with a polymer containing acetal or ketal groups in its main chain (JP-A-53-133429), the combination of a photoacid generator with an enol ether compound (JP-A-55-12995), the combination of a photoacid generator with N-acylimino carbonate compound (JP-A-55-126236), the combination of a photoacid generator with a polymer containing orthoester groups in its main chain (JP-A-56-17345), the combination of a photoacid generator with a tertiary alkyl ester compound (JP-A-60-3625), the combination of a photoacid generator with a silyl ester compound (JP-A-60-10247) and the combinations of a photoacid generator with silyl ether compounds (JP-A-60-37549 and JP-A-60-121446). Those combinations have a quantum yield of greater than 1 in principle, so that they exhibit high sensitivity.

Similarly, the systems described, e.g., in JP-A-59-45439, JP-A-60-3625, JP-A-62-229242, JP-A-63-27829, JP-A-63-36240, JP-A-63-250642, *Polym. Eng. Sce.*, vol. 23, p. 1012 (1983); *ACS. Sym.*, vol. 242, p. 11 (1984); *Semiconductor World*, the November number, p. 91 (1987); *Macromolecules*, vol. 21, p. 1475 (1988); and *SPIE*, vol. 920, p. 42 (1988); wherein the compounds capable of generating acids by exposure to light are combined with tertiary or secondary alkyl (e.g., t-butyl, 2-cyclohexyl) esters or carbonate compounds, can be other examples of the systems of the type which, though they are stable upon storage at room temperature, decompose by heating in the presence of an acid to solubilize in an alkali. Such the systems also have high sensitivity and their absorption in Deep-UV region is weak, compared with a naphthoquinonediazide/novolak resin system. Thus, the use of those systems can also be effective in shortening the wavelengths of a light source.

The foregoing chemically amplified positive resist compositions can be grouped into two main classes, namely a class of three-component systems comprising an alkali-soluble resin, a compound capable of generating an acid by exposure to radiation (a photoacid generator) and a compound capable of inhibiting the dissolution of an alkali-soluble resin containing groups decomposable by an acid (a dissolution inhibitor) and a class of two-component systems comprising a resin containing groups which are decomposed by the reaction with an acid to become soluble in an alkali and a photoacid generator.

Such a two- or three-component positive resist of chemical amplification type forms a resist pattern by undergoing development after a heat treatment in the presence of an acid generated from a photoacid generator by exposure to light.

With respect to photoacid generators used in the aforementioned positive resist of chemical amplification type, although an N-imide sulfonate, an N-oxime sulfonate, an o-nitrobenzyl sulfonate, a pyrogallol trismethanesulfonate and so on were known, the sulfonium or iodonium salts of perfluoro Lewis acids, such as $PF_6^-$, $AsF_6^-$ and $SbF_6^-$, as described in JP-A-59-45439 and *Polym. Eng. Sci.*, 23, 1012 (1983) have been used as typical photoacid generators since they have high photolysis efficiency and excellent image forming capability.

In cases where such photoacid generators are used in resist materials for semiconductors, however, contamination with phosphorus, arsenic and antimony arising from the counter anions of those photoacid generators becomes a problem.

As sulfonium and iodonium compounds free from such contamination, the salts whose counter anion is trifluoromethanesulfonic acid anion, such as those described in JP-A-63-27829, JP-A-02-25850, JP-A-02-150848, JP-A-05-134414 and JP-A-05-232705, are used.

However, the use of those salts gives rise to a problem such that the resist pattern is thinned with the passage of time in the period from exposure to heat treatment or the resist pattern profile has a T-shape top, because the trifluoromethanesulfonic acid generated by exposure has great diffusibility inside the resist film.

Also, the use of toluenesulfonic acid anion as another counter ion of sulfonium and iodonium salts is described, e.g., in JP-A-02-25850, JP-A-02-150848, JP-A-06-43653 and JP-A-06-123972. However, the solubilities of such salts in generally used resist solvents are insufficient, so that those salts have limitations on their addition amounts. Thus, such salts have a sensitivity problem.

SUMMARY OF THE INVENTION

Therefore, one object of the present invention is to solve the aforementioned problems in conventional arts and, more specifically, to provide a positive working photosensitive composition which has high photolysis efficiency, and consequently, has high sensitivity to ensure the formation of an excellent resist pattern.

Another object of the present invention is to provide a positive working photosensitive composition which generates an acid having low diffusibility when exposed to light, thereby ensuring the resist pattern formation free from the thinning due to the passage of time in the period from exposure to heat treatment and preventing the resist pattern profile from having a T-shape top.

Still another object of the present invention is to provide a positive working photosensitive composition which can contain as a photoacid generator a sulfonium or iodonium compound in an arbitrarily increased amount because of its improved solubility in a solvent, thereby enhancing its sensitivity.

As a result of our intensive studies carried out taking the above-described characteristics into account, it has been found that the objects of the present invention can be attained by using a particular sulfonic acid-generating compound as described below in a positive chemical amplification system.

More specifically, the present invention has the following constitution [1] and [4], and further the preferable constitution [2] and [3]:

[1] A positive working photosensitive composition comprising (a) a resin having groups capable of increasing solubility of the resin in an alkali developer through their decomposition due to the action of an acid and (b) a compound represented by formula (I) or (II) generating a sulfonic acid by irradiation with active rays or radiant rays:

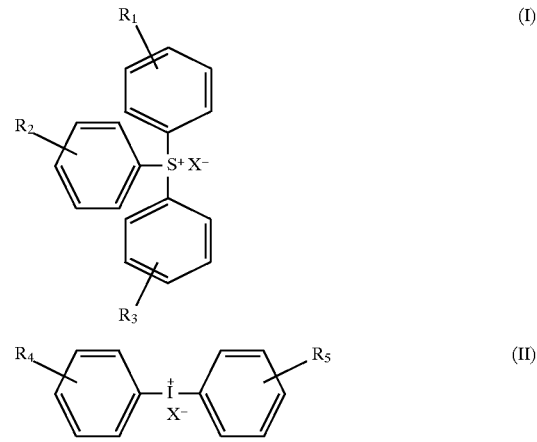

wherein $R_1$, $R_2$, $R_3$, $R_4$ and $R_5$ each represent a hydrogen atom, an alkyl group, a cycloalkyl group, an alkoxy group, a hydroxy group, a halogen atom or a —S—$R_6$ group; $R_6$ represents an alkyl group or an aryl group; and $X^-$ represents a benzenesulfonic, naphthalenesulfonic or anthracenesulfonic acid anion having at least one ester group.

[2] A positive working photosensitive composition as described in the constitution [1], further comprising (c) a low molecular, acid-decomposable, dissolution-inhibiting compound having a molecular weight of no greater than 3,000, having a group capable of being decomposed by an acid and increasing the solubility of the resin in an alkali developer due to the action of the acid.

[3] A positive working photosensitive composition as described in the constitution [1] or [2], further comprising (d) a resin which is insoluble in water but soluble in an aqueous alkali solution.

[4] A positive working photosensitive composition comprising (b) a compound represented by the foregoing formula (I) or (II) generating a sulfonic acid by irradiation with active rays or radiant rays, (c) a low molecular, acid-decomposable, dissolution-inhibiting compound having a molecular weight of no greater than 3,000, having a group capable of being decomposed by an acid and increasing the solubility of the resin in an alkali developer due to the action of the acid and (d) a resin which is insoluble in water but soluble in an aqueous alkali solution.

As mentioned above, the use of the compound of the foregoing formula (I) or (II) as a photoacid generator successfully solves the problem caused in a chemically amplified resist due to a lapse of time in the period from exposure to heat treatment, and heightens the photoacid generator's solubility in a solvent and the photolysis efficiency, thereby ensuring high sensitivity to light and formation of excellent resist patterns.

DETAILED DESCRIPTION OF THE INVENTION

The compounds used in the present invention are illustrated below in detail.

1. Acid Generating Compound of formula (I) or (II)

Examples of the alkyl group represented by $R_1$ to $R_6$ in the foregoing formula (I) or (II) include unsubstituted or substituted alkyl groups containing 1 to 4 carbon atoms, such as a methyl group, an ethyl group, a propyl group, a n-butyl group, a sec-butyl group and a t-butyl group. Examples of the cycloalkyl group represented by $R_1$ to $R_6$ include unsubstituted or substituted cycloalkyl groups containing 3 to 8 carbon atoms, such as a cyclopropyl group, a cyclopentyl group and a cyclohexyl group. Examples of the alkoxy group represented by $R_1$ to $R_6$ include alkoxy groups containing 1 to 4 carbon atoms, such as a methoxy group, an ethoxy group, a hydroxyethoxy group, a propoxy group, a n-butoxy group, an isobutoxy group, a sec-butoxy group and a t-butoxy group. Examples of the halogen atom represented by $R_1$ to $R_6$ include a fluorine atom, a chlorine atom, a bromine atom and an iodine atom. Examples of the aryl group represented by $R_1$ to $R_6$ include unsubstituted or substituted aryl groups containing 6 to 14 carbon atoms, such as a phenyl group, a tolyl group, a methoxyphenyl group and a naphthyl group.

Suitable examples of a substituent which the group represented by $R_1$ to $R_6$ can have include an alkoxy group containing 1 to 4 carbon atoms, a halogen atom (fluorine, chlorine or iodine atom), an aryl group containing 6 to 10 carbon atoms, an alkenyl group containing 2 to 6 carbon atoms, a cyano group, a hydroxy group, a carboxy group, an alkoxycarbonyl group and a nitro group.

The sulfonium and iodonium compound represented by formulae (I) and (II), respectively, used in the present invention have as their counter anion $X^-$ a benzenesulfonic, naphthalenesulfonic or anthracenesulfonic acid anion containing at least one ester group, preferably at least two ester groups. As the sulfonium and iodonium compounds have the counter anions defined above, the acids generating therefrom after exposure (namely, ester group-containing benzenesulfonic, naphthalenesulfonic and anthracenesulfonic acids) are reduced in diffusibility, and the sulfonium and iodonium compounds have improved solubilities in solvents.

As the foregoing ester group, the group represented by formula (a1) or (a2) is suitable:

wherein $R_a$ and $R_b$ represents an alkyl group, a cycloalkyl group, an aralkyl group or an aryl group, preferably an alkyl group containing 1 to 12 carbon atoms, a cycloalkyl group containing 3 to 8 carbon atoms, an aralkyl group containing 7 to 12 carbon atoms or an aryl group containing 6 to 10 carbon atoms. Examples of the alkyl group containing 1 to 12 carbon atoms include straight-chain or branched alkyl groups, such as methyl, ethyl, propyl, n-butyl, sec-butyl, t-butyl, pentyl, hexyl, heptyl, octyl, nonyl, decyl, undecyl and dodecyl groups. Examples of the cycloalkyl group containing 3 to 8 carbon atoms include a cyclopropyl group, a cyclopentyl group and a cyclohexyl group. Examples of the aralkyl group containing 7 to 12 carbon atoms include a benzyl group, a chlorobenzyl group and a methoxybenzyl group. Examples of the aryl group containing 6 to 10 carbon atoms include a phenyl group, a tolyl group, a methoxyphenyl group and a naphthyl group.

In addition to the aforementioned specific substituent(s), the aromatic sulfonic acid anion represented by $X^-$ may have a substituent, such as an alkyl group containing 1 to 4 carbon atoms, an alkoxy group containing 1 to 4 carbon atoms, a halogen atom (fluorine, chlorine, bromine or iodine atom), an aryl group containing 6 to 10 carbon atoms, a cyano group, a sulfide group, a hydroxy group, a carboxy group and a nitro group.

The content of the compound represented by formula (I) or (II) in the total composition is from 0.1 to 20 weight %, preferably from 0.5 to 10 weight %, and more preferably from 1 to 7 weight %, on a solids basis.

Specific examples of those compounds include the following Compounds (I-1) to (I-49) and Compounds (II-1) to (II-36), but these examples are not to be construed as limiting the scope of the invention in any way.

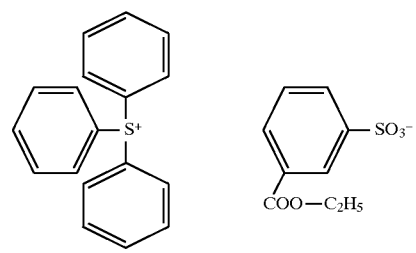

(I-1)

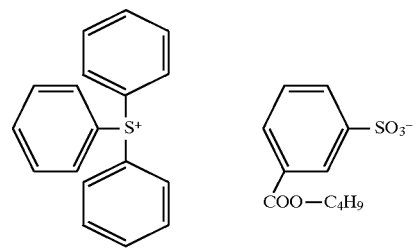

(I-2)

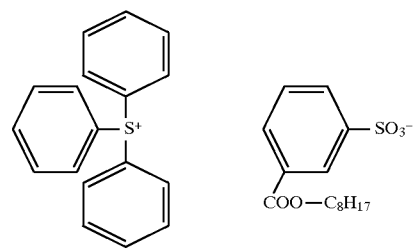

(I-3)

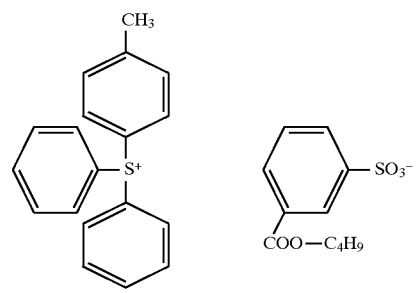

(I-4)

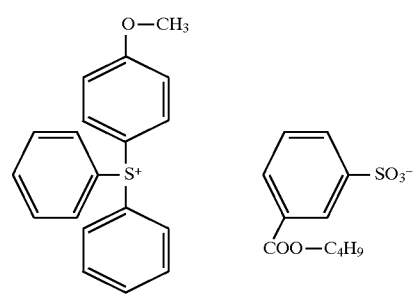

(I-5)

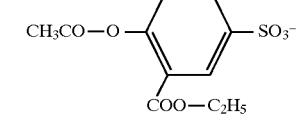
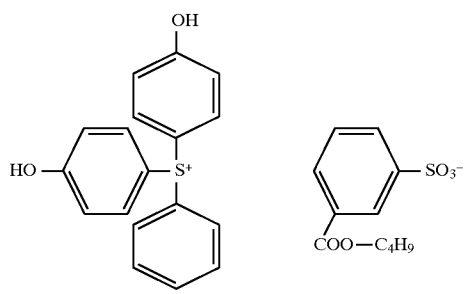 (I-6)
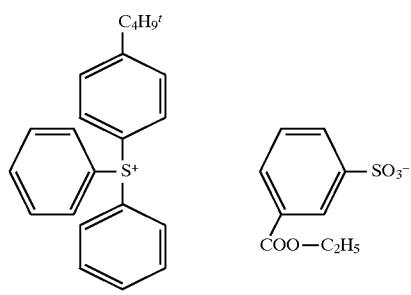 (I-7)
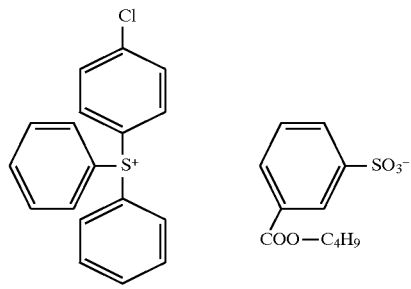 (I-8)
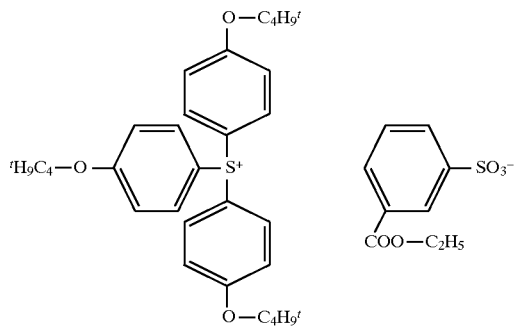 (I-9)
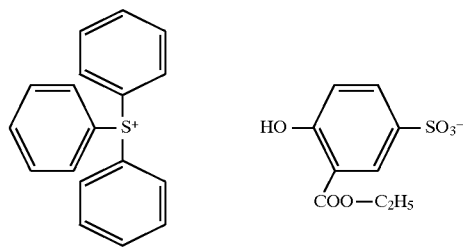 (I-10)
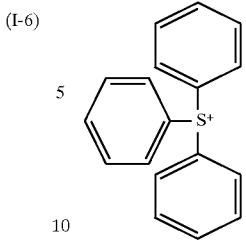 (I-11)
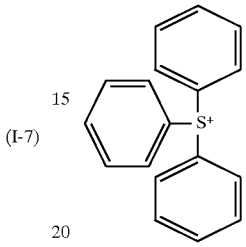 (I-12)
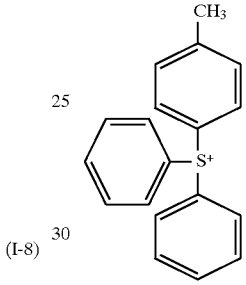 (I-13)
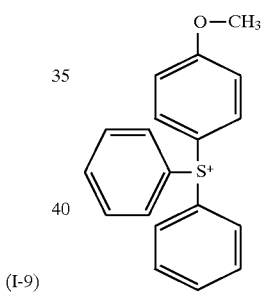 (I-14)
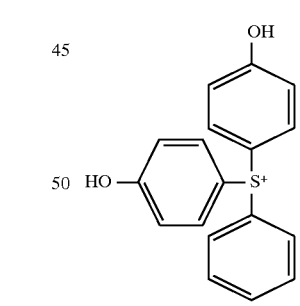 (I-15)
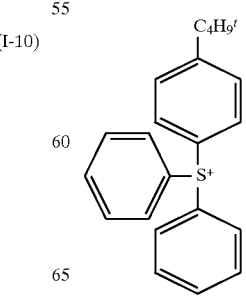 (I-16)

-continued
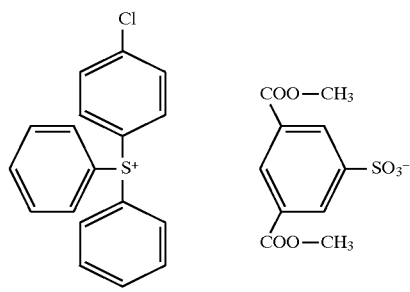 (I-17)
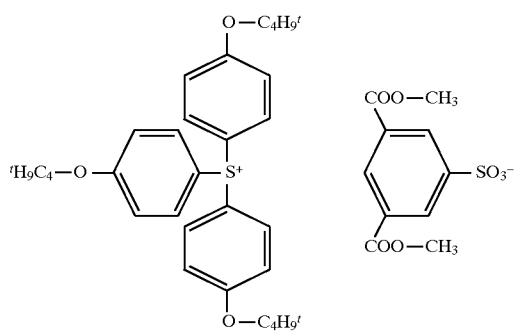 (I-18)
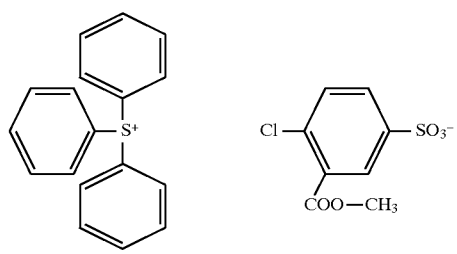 (I-19)
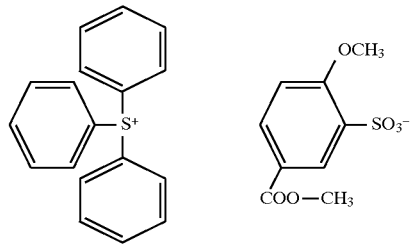 (I-20)
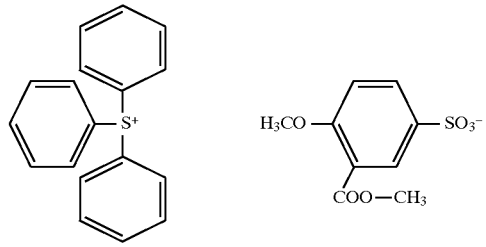 (I-21)
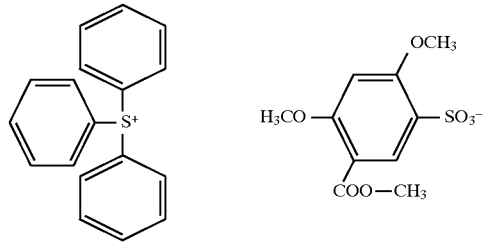 (I-22)
-continued
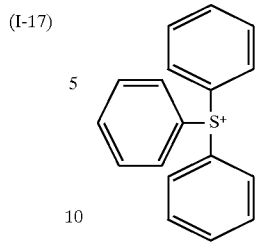 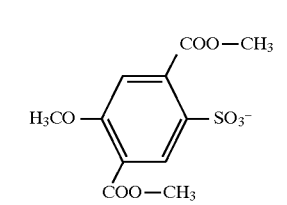 (I-23)
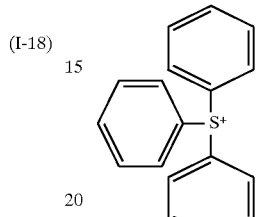 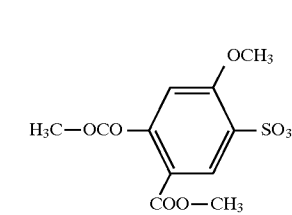 (I-24)
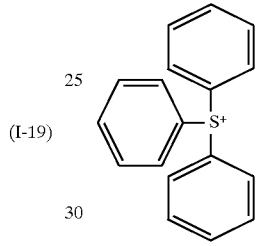 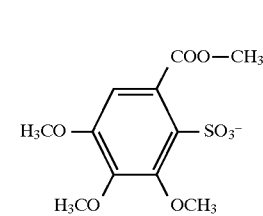 (I-25)
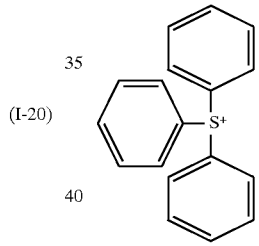 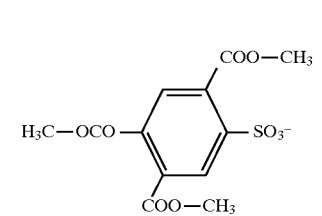 (I-26)
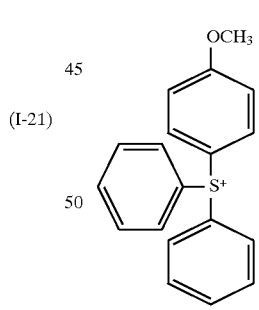 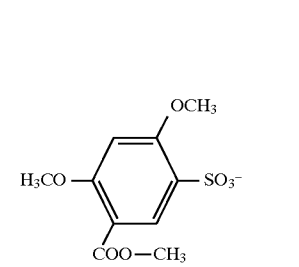 (I-27)
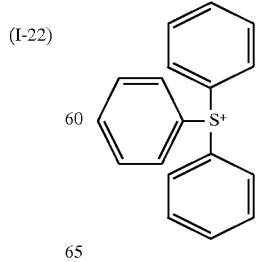 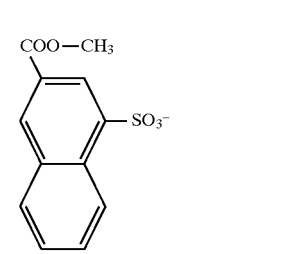 (I-28)

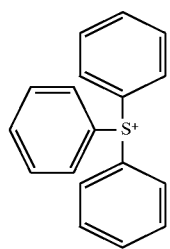 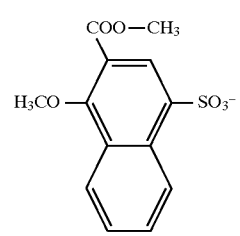 (I-29)
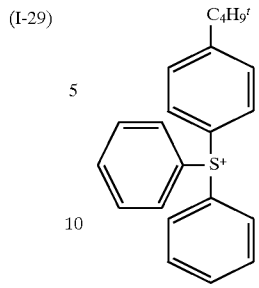 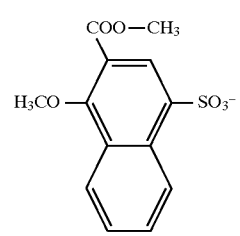 (I-34)
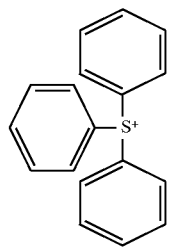 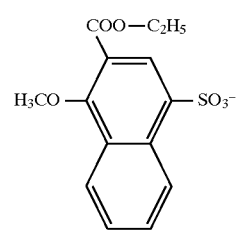 (I-30)
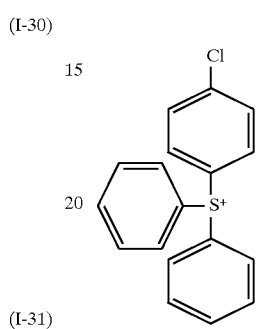 (I-35)
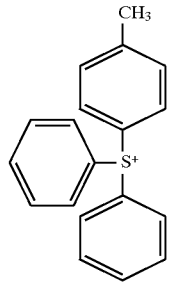 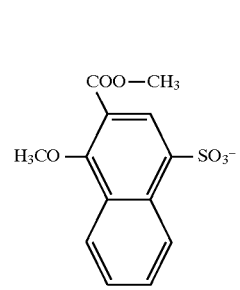 (I-31)
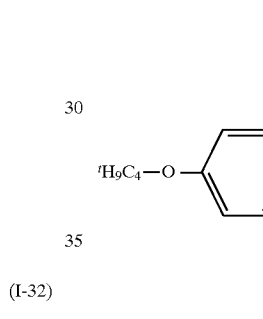 (I-36)
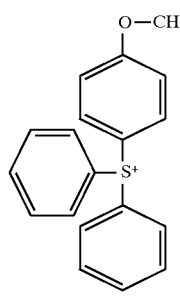 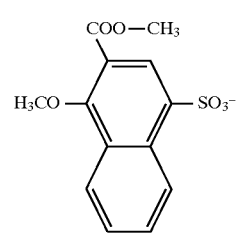 (I-32)
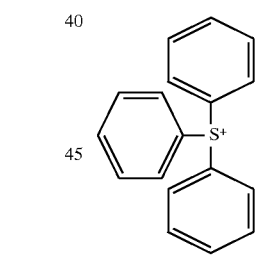 (I-37)
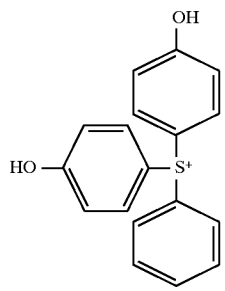 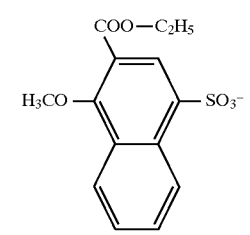 (I-33)
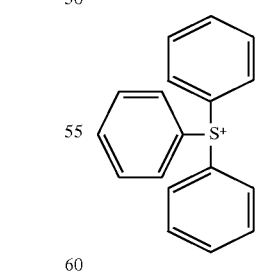 (I-38)

-continued
(I-39)
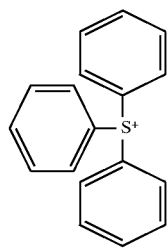 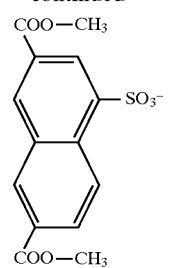
(I-40)
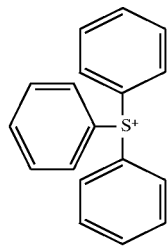 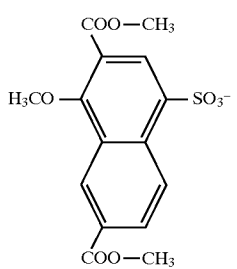
(I-41)
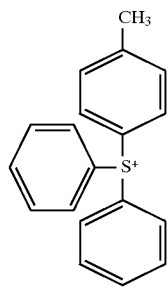 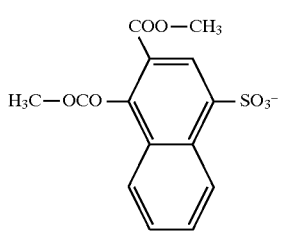
(I-42)
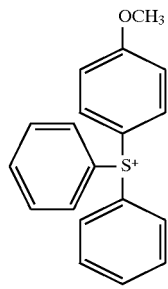 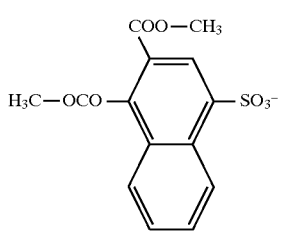
(I-43)
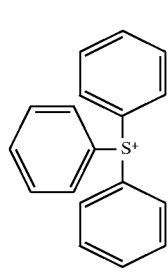 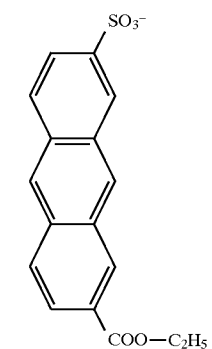
-continued
(I-44)
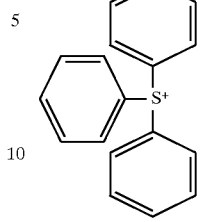 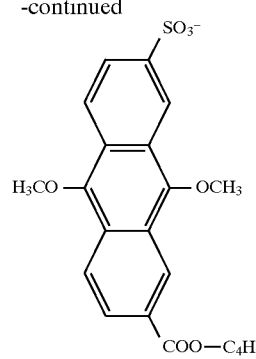
(I-45)
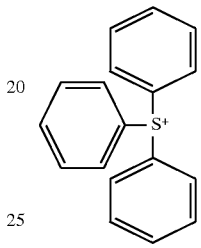 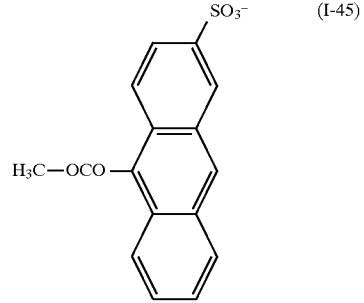
(I-46)
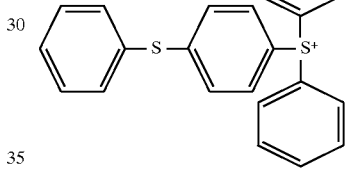 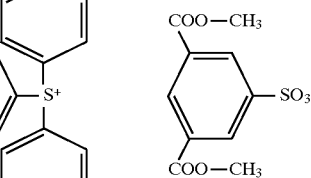
(I-47)
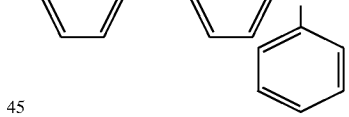 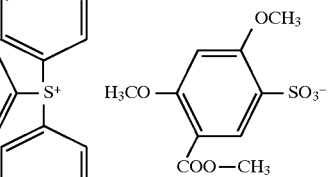
(I-48)
 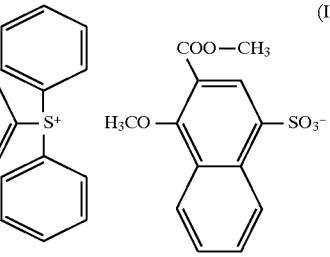
(I-49)
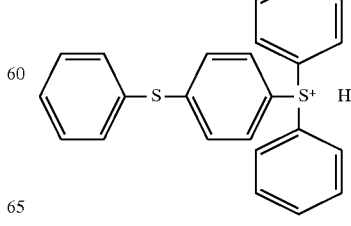 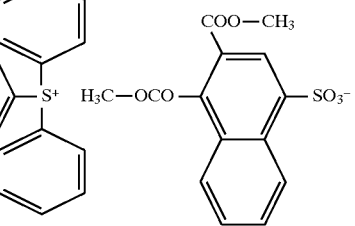

(II-1) 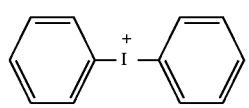 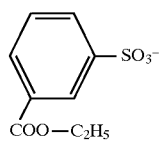
(II-2) 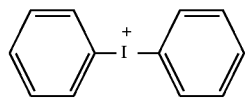 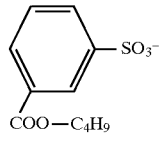
(II-3) 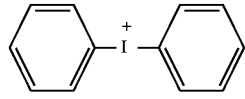 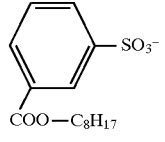
(II-4) 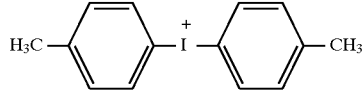 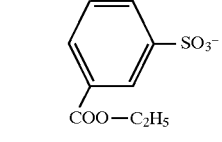
(II-5) 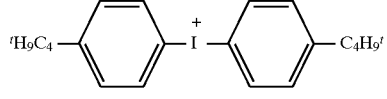 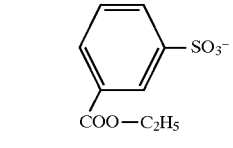
(II-6) 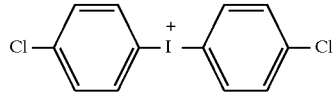 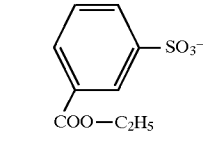
(II-7) 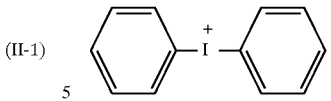 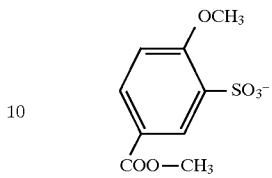
(II-8) 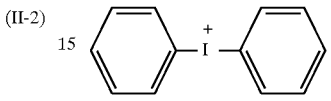 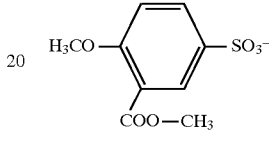
(II-9) 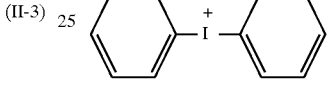 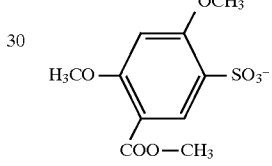
(II-10) 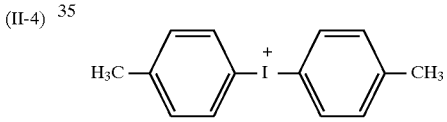 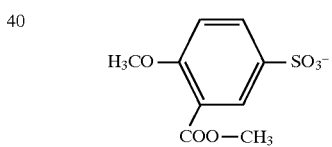
(II-11) 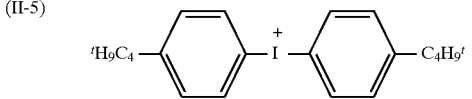 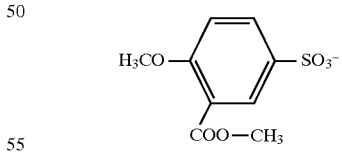
(II-12) 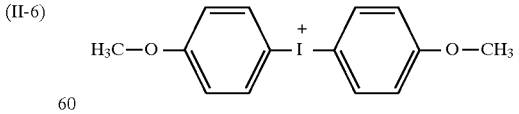 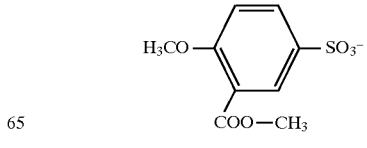

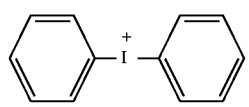
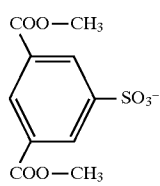
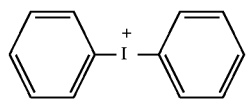
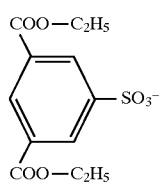
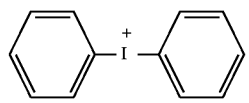
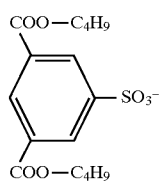
(II-13)
(II-14)
(II-15)
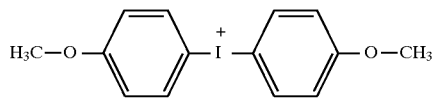
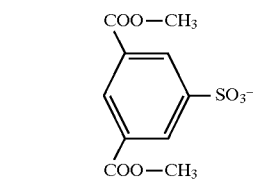
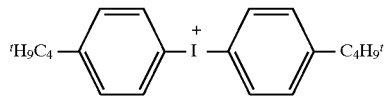
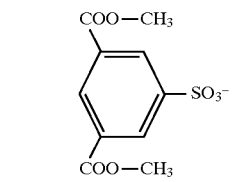
(II-16)
(II-17)
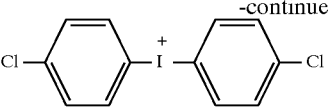
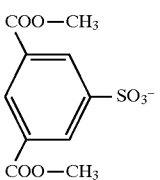
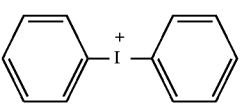
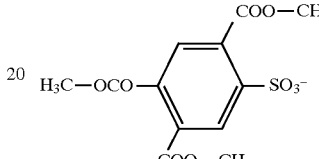
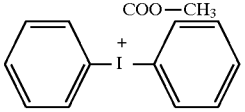
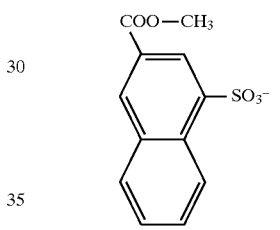
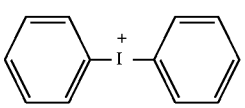
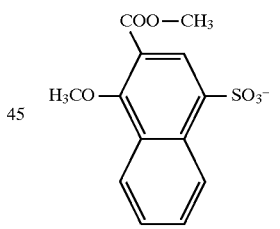
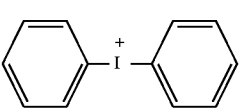
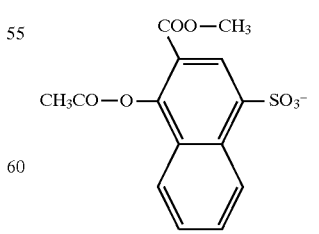
(II-18)
(II-19)
(II-20)
(II-21)
(II-22)

(II-23)
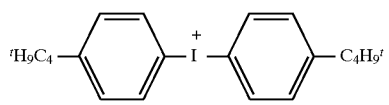
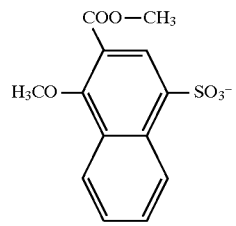
(II-24)
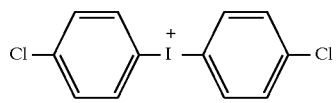
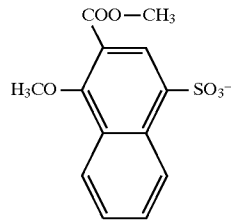
(II-25)
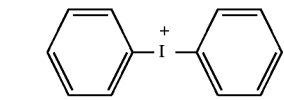
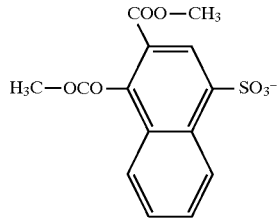
(II-26)
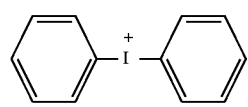
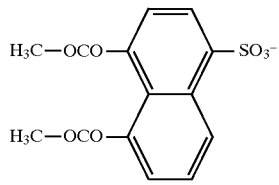
(II-27)
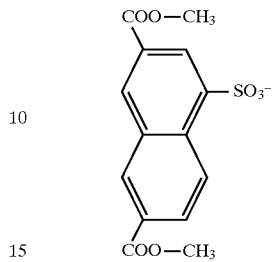
(II-28)
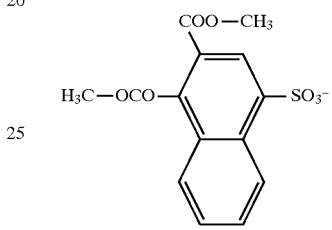
(II-29)
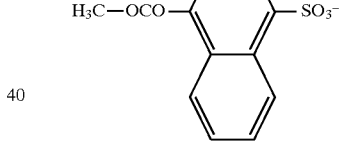
(II-30)
(II-31)
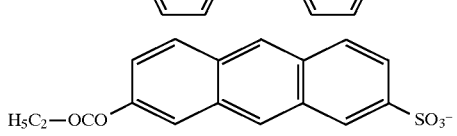

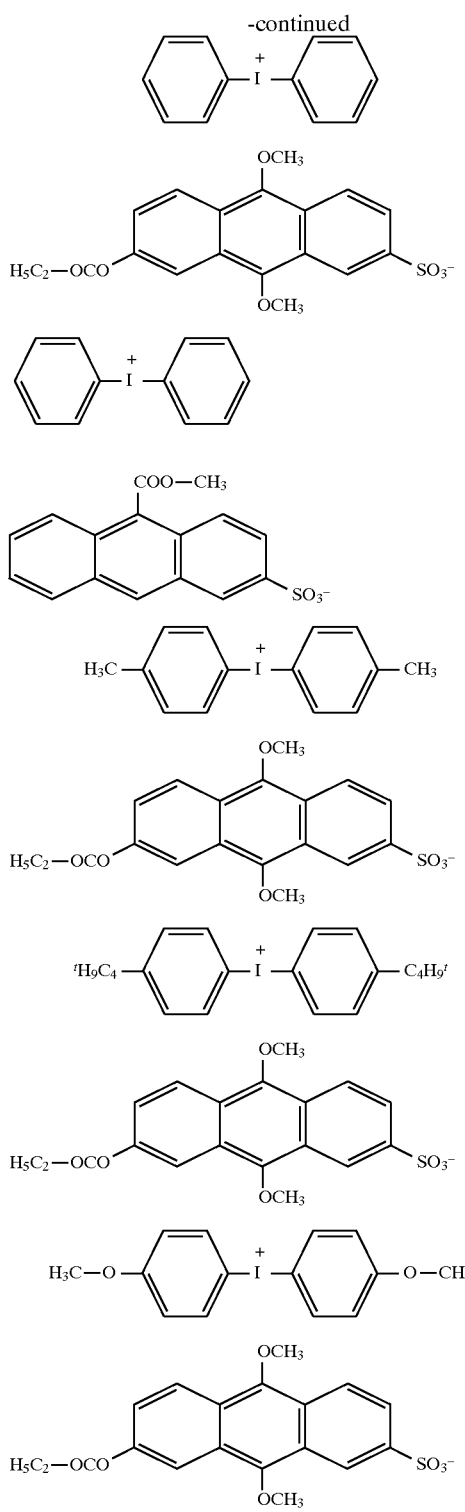

The compound represented by formulae (I) or (II) can be prepared by carrying out in an aqueous solution a base exchange reaction between the corresponding Cl⁻ salt, e.g., the corresponding onium chloride (or the compound of formula (I) or (II) whose counter ion, X⁻, is replaced by Cl_) and a compound represented by X⁻Y⁺ (wherein X⁻ has the same meaning as in formula (I) or (II), and Y⁺ is a cation, such as $H^+$, $Na^+$, $K^+$, $NH_4^+$ and $N(CH_3)_4^+$).

2. Other Acid-Generating Compounds usable together with Present Compounds

In addition to the aforementioned sulfonic acid-generating compounds of formulae (I) and (II), other compounds which are decomposed by irradiation with active rays or radiation to generate acids may also be used in the present invention.

The ratio of the present compound of formula (I) or (II) to a photoacid generator usable together therewith is from 100/0 to 20/80, preferably from 90/10 to 40/60, and more preferably from 80/20 to 50/50, by mole.

The photoacid generator which can be suitably used together with the compound of formula (I) or (II) can be selected from the group consisting of a photoinitiator for photo cationic polymerization, a photoinitiator for photo radical polymerization, a photodecolorizer for dyes, a photo discoloring agent, well-known photoacid generators used for microresist and the like, and a mixture of two or more of the above agents.

Examples of compounds used as those agents include the onium salt such as diazonium salts described, e.g., in S. I. Schlesinger, *Photogr. Sci. Eng.*, 18, 387 (1974), and T. S. Bal et al., *Polymer*, 21, 423 (1980); ammonium salts described, e.g., in U.S. Pat. Nos. 4,069,055, 4,069,056 and U.S. Pat. No. Re 27,992, and Japanese Patent Application No. 03-140140; phosphonium salts described, e.g., in D. C. Necker et al., *Macromolecules*, 17, 2468 (1984), C. S. Wen et al., *Teh. Proc. Conf. Rad. Curing ASIA*, p. 478, Tokyo (October, 1988), and U.S. Pat. Nos. 4,069,055 and 4,069, 056; iodonium salts described, e.g., in J. V. Crivello et al., *Macromolecules*, 10(6), 1307 (1977), *Chem. & Eng. News*, November 28, p. 31 (1988), European Patent 0,104,143, U.S. Pat. Nos. 339,049 and 410,210, JP-A-02-150848 and JP-A-02-296514; sulfonium salts described, e.g., in J. V. Crivello et al., *Polymer J.*, 17, 73 (1985), J. V. Crivello et al., *J. Org. Chem.*, 43, 3055 (1978), W. R. Watt et al., *J. Polymer Sci.*, Polymer Chem. Ed., 22, 1789 (1984), J. V. Crivello et al., *Polymer Bull.*, 14, 279 (1985), J. V. Crivello et al., *Macromolecules*, 14(5), 1141 (1981), J. V. Crivello et al., *J. Polymer Sci.*, Polymer Chem. Ed., 17, 2877 (1979), European Patents Nos. 0,370,693, 3,902,114, 0,233,567, 0,297, 443 and 0,297,422, U.S. Pat. Nos. 4,933,377, 161,811, 410,201, 339,049, 4,760,013, 4,734,444 and 2,833,827, and German Patents 2,904,626, 3,604,580 and 3,604,581; selenonium salts described, e.g., in J. V. Crivello et al., *Macromolecules*, 10 (6), 1307 (1977), and J. V. Crivello et al., *J. Polymer Sci.*, Polymer Chem. Ed., 17, 1047 (1979) and arsonium salts described, e.g., in C. S. Wen et al., Teh. *Proc. Conf. Rad. Curing ASIA*, p. 478, Tokyo (October, 1988); the organic halogeno-compounds described, e.g., in U.S. Pat. No. 3,905,815, JP-B-46-4605 (The term "JP-B" as used herein means an "examined Japanese patent publication"), JP-A-48-36281, JP-A-55-32070, JP-A-60-239736, JP-A-61-169835, JP-A-61-169837, JP-A-62-58241, JP-A-62-212401, JP-A-63-70243 and JP-A -63-298339; the organometallic compounds/organic halide compounds described, e.g., in K. Meier et al., *J. Rad. Curing*, 13(4), 26 (1986), T. P. Gill et al., *Inorg. Chem.*, 19, 3007 (1980), D. Astruc, *Acc. Chem. Res.*, 19(12), 377 (1896), and JP-A-02-161445; the photoacid generators having protective groups of o-nitrobenzyl type described, e.g., in S. Hayase et al., *J. Polymer Sci.*, 25, 753 (1987), E. Reichmanis et al., *J. Polymer Sci.*, Polymer Chem. Ed., 23, 1 (1985), Q. Q. Zhu et al., *J. Photochem.*, 36, 85, 39, 317 (1987), B. Amit et al., *Tetrahedron Lett.*, (24) 2205 (1973), D. H. R. Barton et al., *J. Chem. Soc.*, 3571 (1965), P. M. Collins et al., *J. Chem. Soc.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. Imaging Technol.*, 11(4), 191 (1985), H. M.

Houlihan et al., *Macromolecules*, 21, 2001 (1988), P. M. Collins et al., *J. Chem. Soc.*, Chem. Commun., 532 (1972), S. Hayase et al., *Macromolecules*, 18, 1799 (1985), E. Reichmanis et al., *J. Electrochem. Soc.*, Solid State Sci. Technol., 130(6), F. M. Houlihan et al., *Macromolecules*, 21, 2001 (1988), European Patent Nos. 0,290,750, 0,046,083, 0,156,535, 0,271,851 and 0,388,343, U.S. Pat Nos. 3,901, 710 and 4,181,531, JP-A-60-198538 and JP-A-53-133022; the compounds generating sulfonic acid by photolysis, representatives of which are the iminosulfonates described, e.g., in M. Tunooka et al., *Polymer Preprints Japan*, 35(8), G. Berner et al., *J. Rad. Curing*, 13(4), W. J. Mijs et al., *Coating Technol.*, 55(697), 45 (1983), Akzo, H. Adachi et al., *Polymer Preprints Japan*, 37(3), European Patent Nos. 0,199, 672, 0,084,515, 0,199,672, 0,044,115 and 0,101,122, U.S. Pat. Nos. 618,564, 4,371,605 and 4,431,774, JP-A-64-18143, JP-A-02-245756 and Japanese Patent Application No. 03-140109; and the disulfone compounds described, e.g., in JP-A-61-166544.

In addition, polymers into the main chain or side chains of which those groups or compounds capable of generating acids under light are introduced, such as the compounds described, e.g., in M. E. Woodhouse et al., *J. Am. Chem. Soc.*, 104, 5586 (1982), S. P. Pappas et al., *J. Imaging Sci.*, 30(5), 218 (1986), S. Kondo et al., *Makromol. Chem.*, Rapid Commun., 9, 625 (1988), Y. Yamada et al., *Makromol. Chem.*, 152, 153, 163 (1972), J. V. Crivello et al., *J. Polymer Sci.*, Polymer Chem. Ed., 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, can also be employed.

Further, the compounds capable of generating acids under light described, e.g., in V. N. R. Pillai, *Synthesis*, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,779,778 and European Patent No. 0,126,712, can be also employed.

Of the compounds which can be decomposed by irradiation with active rays or radiation to generate acids described above, the following compounds are especially advantageous to combined use with the compounds of formulae (I) and (II):

(1) A trihalomethyl-substituted oxazole derivatives represented by the following formula (PAG1), or a trihalomethyl-substituted s-triazine derivatives represented by the following formula (PAG2);

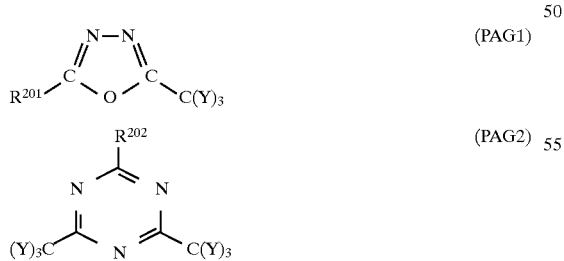

wherein $R^{201}$ represents a substituted or unsubstituted aryl or alkenyl group, $R^{202}$ represents a substituted or unsubstituted aryl, alkenyl or alkyl group or —$C(Y)_3$, and Y represents a chlorine or bromine atom.

Specific examples of such the compounds are illustrated below, but these examples should not be construed as limiting the scope of the present invention.

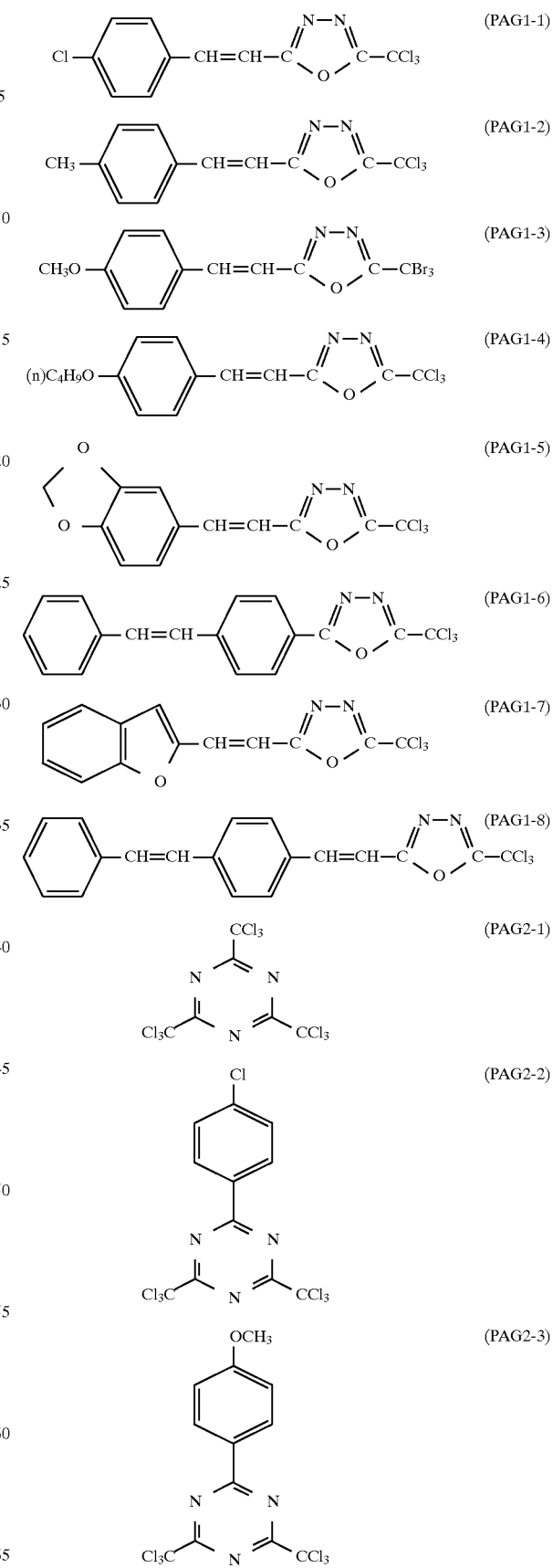

(PAG2-4)

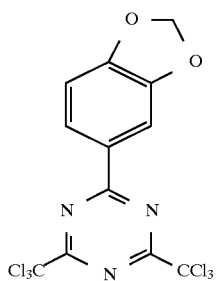

(PAG2-5)

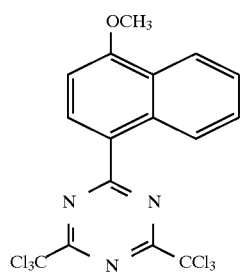

(PAG2-6)

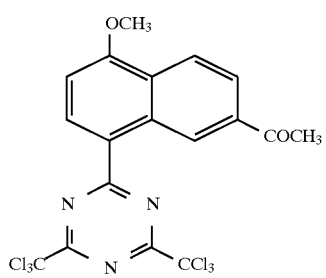

(PAG2-7)

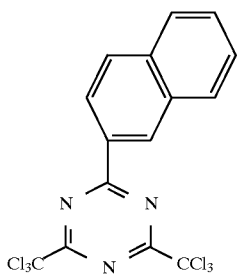

(PAG2-8)

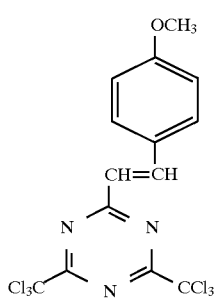

(PAG2-9)

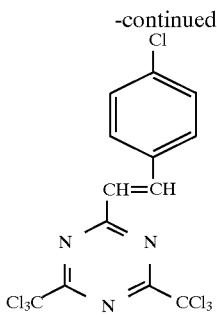

(PAG2-10)

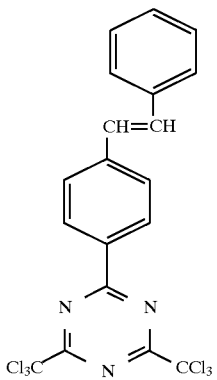

(2) An iodonium salt of the following formula (PAG3), or a sulfonium salt of the following formula (PAG4):

 (PAG3)

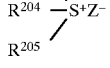 (PAG4)

wherein $Ar^1$ and $Ar^2$ each represent an unsubstituted or substituted aryl group. Suitable examples of substituent thereof include an alkyl group, a haloalkyl group, a cycloalkyl group, an aryl group, an alkoxy group, a nitro group, a carboxyl group, an alkoxycarbonyl group, a hydroxy group, a mercapto group and a halogen atom; $R^{203}$, $R^{204}$ and $R^{205}$ each represent a substituted or unsubstituted alkyl or aryl group, preferably an aryl group containing 6 to 14 carbon atoms, an alkyl group containing 1 to 8 carbon atoms or substituted derivatives thereof. Examples of substituents for the aryl group include alkoxy having 1 to 8 carbon atoms, alkyl having 1 to 8 carbon atoms, nitro, carboxyl, hydroxy and halogen. Examples of substituents for the alkyl group include alkoxy having 1 to 8 carbon atoms, carboxyl and alkoxycarbonyl; $Z^-$ is a counter anion, such as a perfluoroalkanesulfonic acid anion (e.g., $CF_3SO_3^-$) and a pentafluorobenzenesulfonic acid anion; and wherein two among $R^{203}$, $R^{204}$ and $R^{205}$, and Ar1 and Ar2 may combine with each other via a single bond or a substituent.

Specific examples of such compounds are illustrated below, but these examples should not be construed as limiting the scope of the present invention.

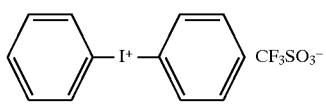 (PAG3-1)

-continued (PAG3-2) Ph-I⁺-C₆H₄-OCH₃  CF₃SO₃⁻

(PAG3-3) (3-O₂N-C₆H₄)-I⁺-(3-NO₂-C₆H₄)  CF₃SO₃⁻

(PAG3-4) Ph-I⁺-C₆H₄-NO₂  CF₃SO₃⁻

(PAG3-5) (4-H₃C-C₆H₄)-I⁺-(4-CH₃-C₆H₄)  CF₃SO₃⁻

(PAG3-6) (3,4-(H₃C)₂-C₆H₃)-I⁺-(3,4-(CH₃)₂-C₆H₃)  CF₃SO₃⁻

(PAG3-7) (4-(n)C₇H₁₅-C₆H₄)-I⁺-(4-(n)C₇H₁₅-C₆H₄)  CF₃SO₃⁻

(PAG3-8) (4-Cl-C₆H₄)-I⁺-(4-Cl-C₆H₄)  CF₃SO₃⁻

(PAG3-9) (4-F₃C-C₆H₄)-I⁺-(4-CF₃-C₆H₄)  CF₃SO₃⁻

(PAG3-10) (3-H₃COOC-C₆H₄)-I⁺-(3-COOCH₃-C₆H₄)  CF₃SO₃⁻

(PAG3-11) (2,4-Cl₂-C₆H₃)-I⁺-(2,4-Cl₂-C₆H₃)  CF₃SO₃⁻

(PAG3-12) (4-ᵗBu-C₆H₄)-I⁺-(4-ᵗBu-C₆H₄)  CF₃SO₃⁻

(PAG3-13) dibenzoiodolium  CF₃SO₃⁻

(PAG3-14) chloro-dibenzoiodolium  CF₃SO₃⁻

(PAG3-15) (1-naphthyl)-I⁺-(1-naphthyl)  CF₃SO₃⁻

(PAG3-16) Ph₂I⁺  C₆F₅SO₃⁻

(PAG3-17) Ph₂I⁺  C₈F₁₇SO₃⁻

(PAG4-1) Ph₃S⁺  CF₃SO₃⁻

(PAG4-2) Ph₃S⁺  C₈F₁₇SO₃⁻

(PAG4-3) Ph₃S⁺  C₆F₅SO₃⁻

(PAG4-4) (4-H₃C-C₆H₄)-S⁺-(4-OC₂H₅-C₆H₄)₂  CF₃SO₃⁻

(PAG4-5) (4-H₃CO-C₆H₄)-S⁺-(4-Cl-C₆H₄)₂  CF₃SO₃⁻

(PAG4-6) (4-HO-C₆H₄)-S⁺(CH₃)₂  CF₃SO₃⁻

(PAG4-7) (3,5-(H₃C)₂-4-HO-C₆H₂)-S⁺(CH₃)₂  CF₃SO₃⁻

(PAG4-8) (4-HO-C₆H₄)-S⁺(tetramethylene)  CF₃SO₃⁻

-continued

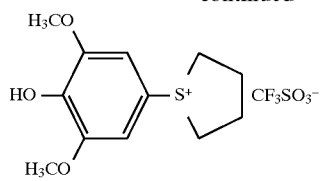 (PAG4-9)

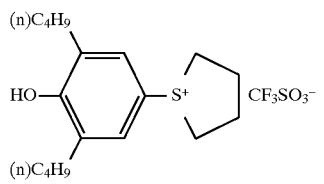 (PAG4-10)

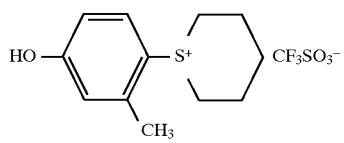 (PAG4-11)

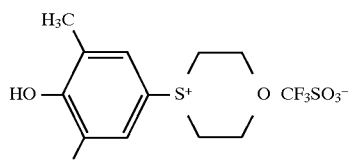 (PAG4-12)

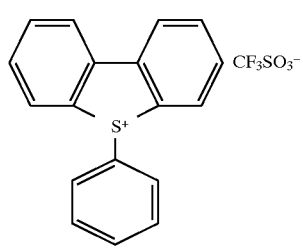 (PAG4-13)

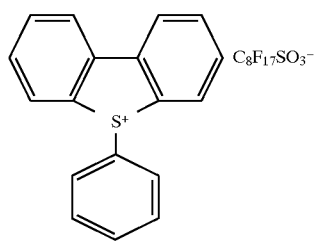 (PAG4-14)

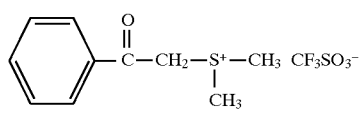 (PAG4-15)

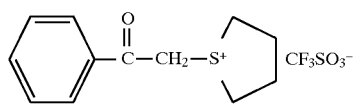 (PAG4-16)

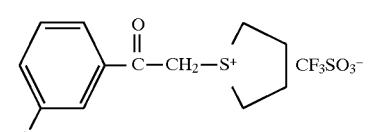 (PAG4-17)

-continued

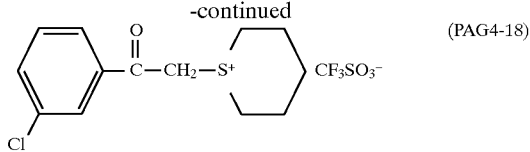 (PAG4-18)

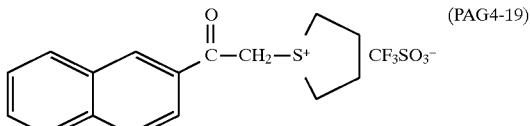 (PAG4-19)

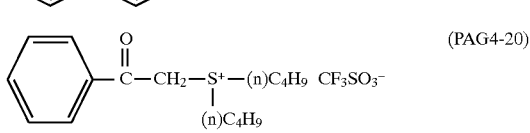 (PAG4-20)

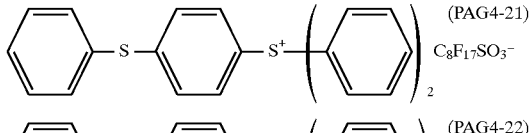 (PAG4-21)

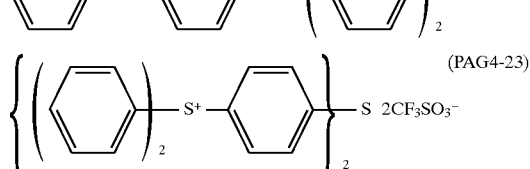 (PAG4-22)

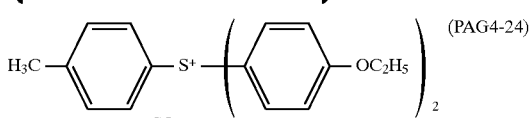 (PAG4-23)

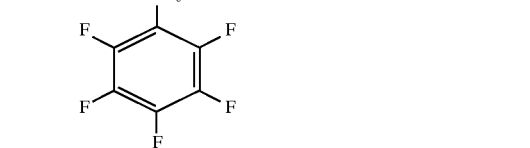 (PAG4-24)

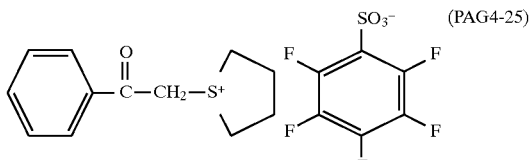 (PAG4-25)

The above-illustrated onium salts of formulae (PAG3) and (PAG4) are well-known compounds, and can be synthesized using the methods described, e.g., in J. W. Knapczyk et al., *J. Am. Chem. Soc.*, 91, 145 (1969), A. L. Maycok et al., *J. Org. Chem.*, 35, 2532 (1970), E. Goethas et al., *Bull. Soc. Chem. Belg.*, 73, 546 (1964), H. M. Leicester, *J. Am. Chem. Soc.*, 51, 3587 (1929), J. V. Crivello et al., J. Polymer Chem. Ed., 18, 2677 (1980), U.S. Pat. Nos. 2,807,648 and 4,247,473, and JP-A-53-101331.

(3) A disulfone compound of the following formula (PAG5) and an iminosulfonate compound of the following formula (PAG6):

$$Ar^3-SO_2-SO_2-Ar^4 \quad \text{(PAG5)}$$

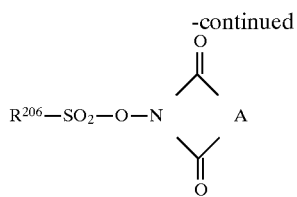
(PAG6)

wherein Ar³ and Ar⁴ each represent a substituted or unsubstituted aryl group, $R^{206}$ is a substituted or unsubstituted alkyl or aryl group, and A is a substituted or unsubstituted alkylene, alkenylene or arylene group.

Specific examples of such compounds are illustrated below, but these examples should not be construed as limiting the scope of the present invention.

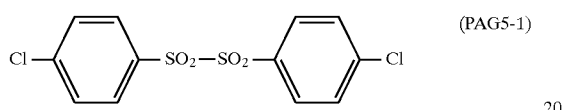
(PAG5-1)

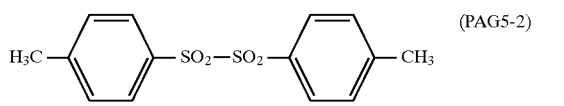
(PAG5-2)

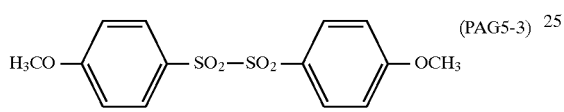
(PAG5-3)

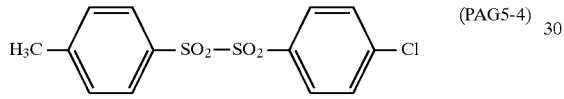
(PAG5-4)

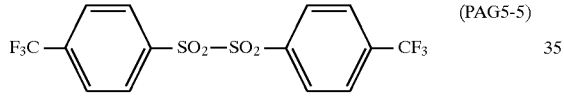
(PAG5-5)

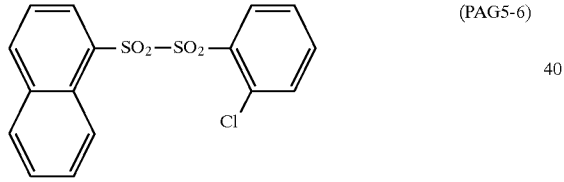
(PAG5-6)

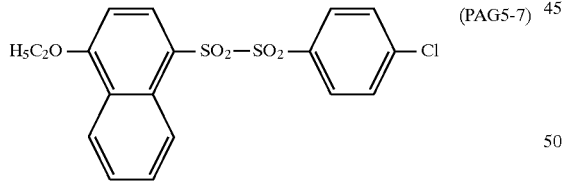
(PAG5-7)

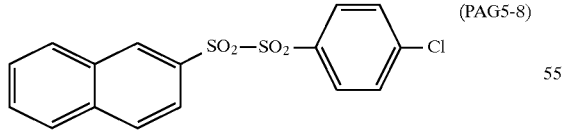
(PAG5-8)

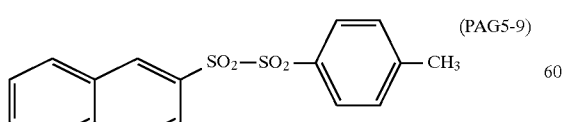
(PAG5-9)

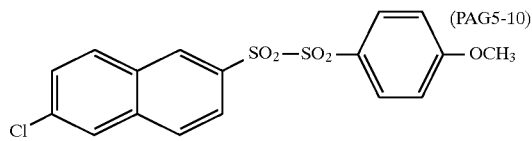
(PAG5-10)

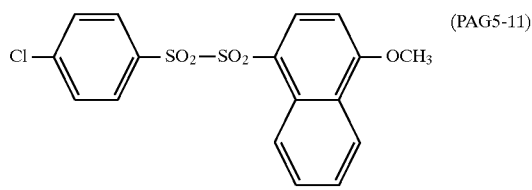
(PAG5-11)

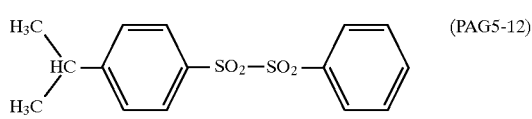
(PAG5-12)

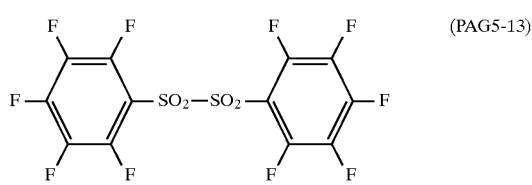
(PAG5-13)

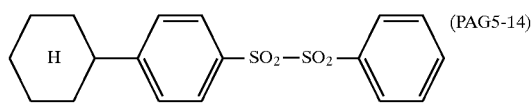
(PAG5-14)

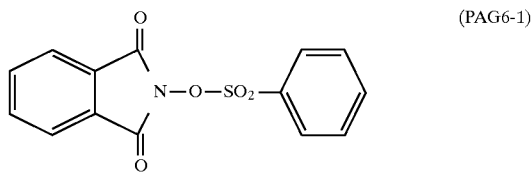
(PAG6-1)

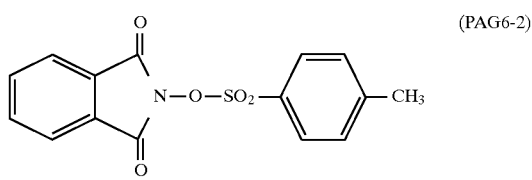
(PAG6-2)

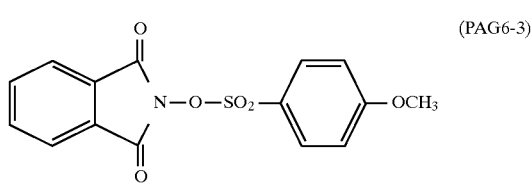
(PAG6-3)

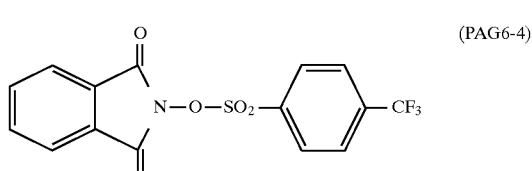
(PAG6-4)

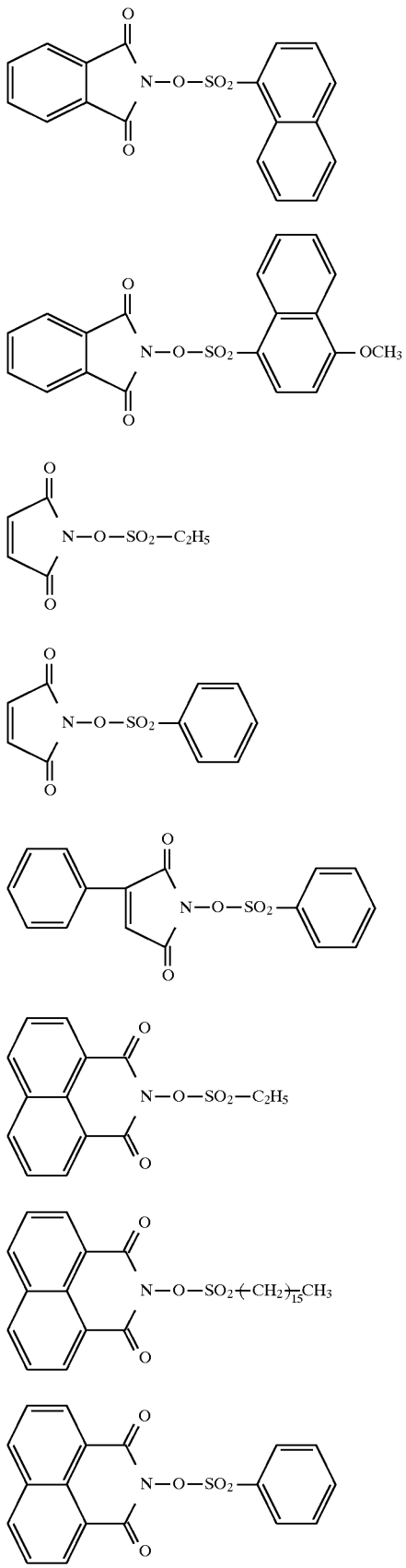

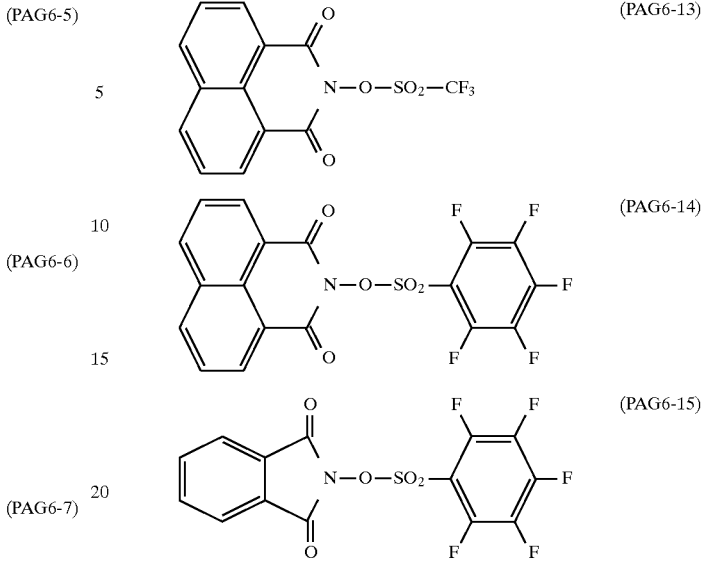

3. Resin having Groups capable of decomposing by Action of Acid to increase Solubility of Resin in Alkali Developer As the resin used in a resist of chemical amplification type, which has groups capable of being decomposed by an acid to increase the solubility in an alkali developer, such acid-decomposable groups may be present in either main chain or side chains of the resin, or in both main and side chains. However, it is preferable for the resin to have such the acid-decomposable groups in side chains.

The acid-decomposable groups suitable for the resin are groups represented by formulae —COO—$A^0$ and —O—$B^0$. Examples of the moieties containing such groups include those represented by —$R^0$—COO—$A^0$ or —Ar—O—$B^0$.

Herein, $A^0$ represents a group of formula —C($R^{01}$)($R^{02}$)($R^{03}$), —Si($R^{01}$)($R^{02}$)($R^{03}$) or —C($R^{04}$)($R^{05}$)—O—$R^{06}$; and $B^0$ represents $A^0$ or —CO—O—$A^0$, wherein $R^0$, $R^{01}$, $R^{02}$, $R^{03}$, $R^{04}$, $R^{05}$, $R^{06}$ and Ar have the same meanings as defined hereinafter.

Specific examples of an acid-decomposable groups suitable for the resin include a silyl ether group, a cumyl ester group, an acetal group, a tetrahydropyranyl ether group, a tetrahydropyranyl ester group, an enol ether group, an enol ester group, a t-alkyl ether group, a t-alkyl ester group and a t-alkyl carbonate group. Of these groups, a t-alkyl ester group, a t-alkyl carbonate group, a cumyl ester group, an acetal group and a tetrahydropyranyl ether group are preferred over the others.

As a mother resin to which those acid-decomposable groups are attached as side chains, alkali-soluble resins having —OH groups or —COOH groups, preferably —$R^0$—COOH or —Ar—OH groups, in their side chains are exemplified, which are described below in detail.

It is desirable for those alkali-soluble resins that their dissolution rates in an alkali be at least 170 Å/second, particularly preferably at least 330 Å/second, when measured with 0.261N tetramethylammonium hydroxide (TMAH) at 23° C.

Further, it is desirable from the viewpoint of achieving a rectangular profile to use an alkali-soluble resin having a high transmissivity for far ultraviolet light or excimer laser beam. More specifically, when an alkali-soluble resin is formed into a 1 μm-thick film, it is desirable for the resin film to have a transmissivity of from 20 to 90% at 248 nm.

Examples of the alkali-soluble resins particularly advantageous from the foregoing viewpoint include homo- and copolymers of o-, m- and poly(hydroxystyrenes), a hydrogenated poly(hydroxystyrene), a halogen- or alkyl-substituted poly(hydroxystyrene), a partially O-alkylated or O-acylated poly(hydroxystyrene), a styrene-hydroxystyrene copolymer, an α-methylstyrene-hydroxystyrene copolymer and a hyrogenated novolak resin.

The resin used in the present invention, which has acid-decomposable groups, can be prepared, as disclosed in European Patent No. 0,254,853, JP-A-02-25850, JP-A-03-223860 and JP-A-04-251259, by reacting a precursor of the acid-decomposable group with an alkali-soluble resin, or by copolymerizing an acid-decomposable group-attached monomer and other various monomers including a monomer containing an alkali-soluble group.

Specific examples of an acid-decomposable group-containing resin used in the present invention are illustrated below, but these examples should not be construed as limiting the scope of the present invention.

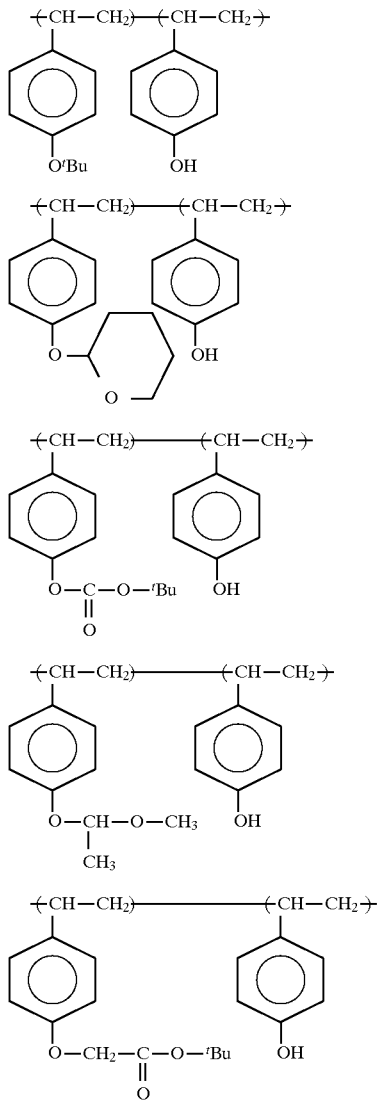

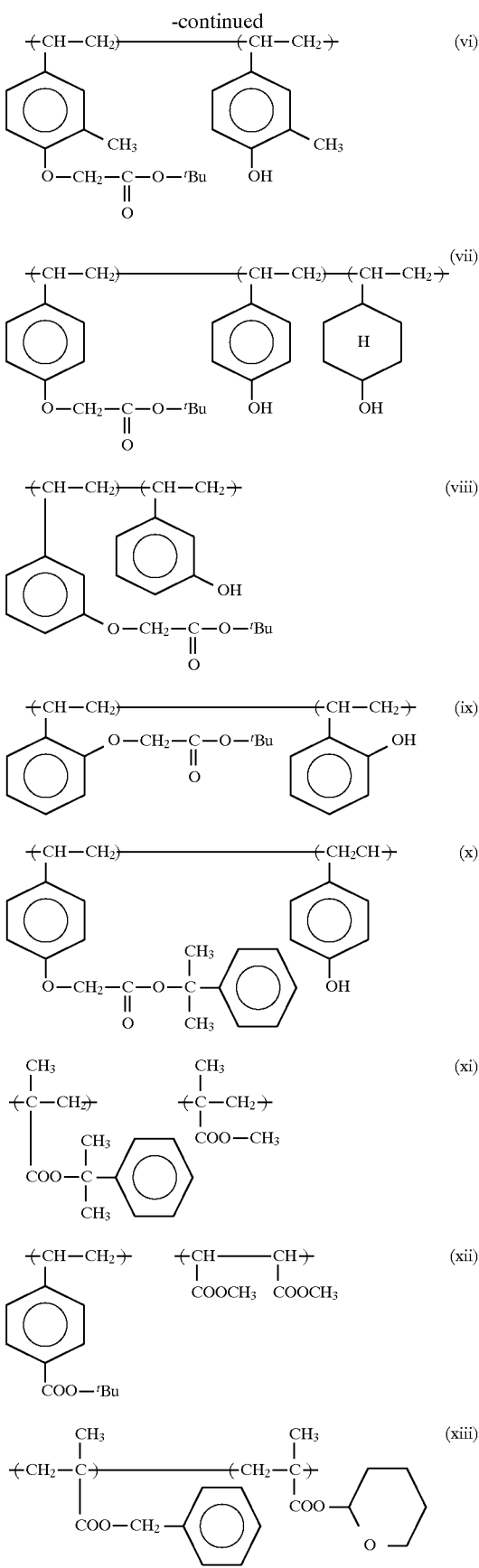

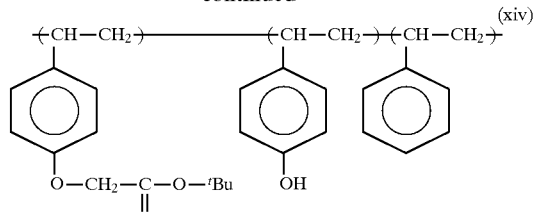 (xiv)

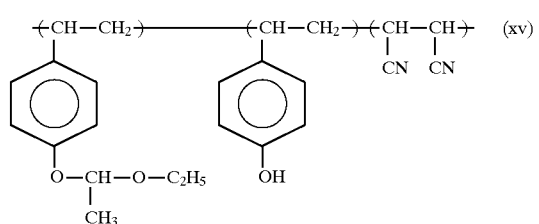 (xv)

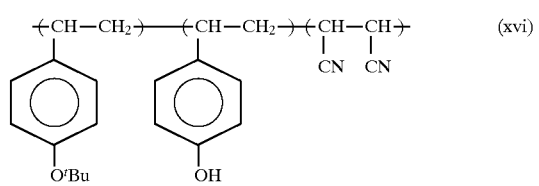 (xvi)

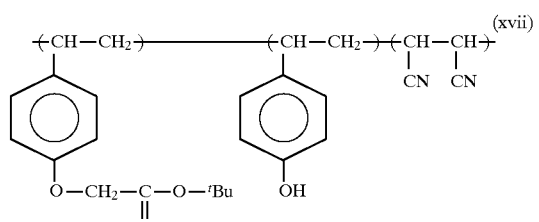 (xvii)

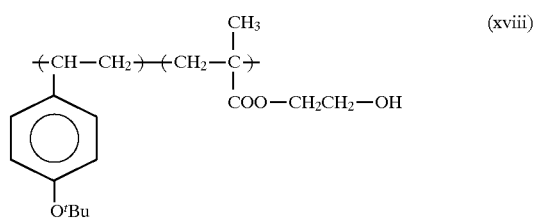 (xviii)

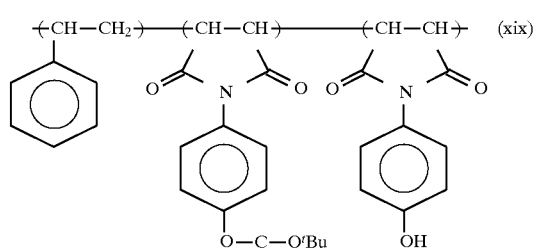 (xix)

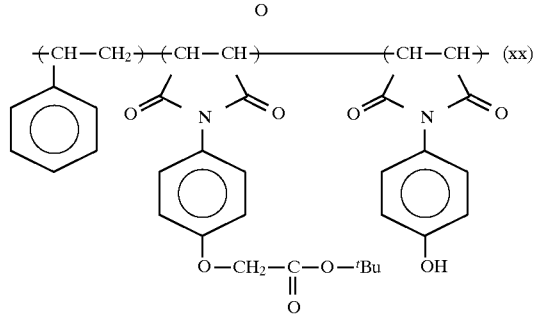 (xx)

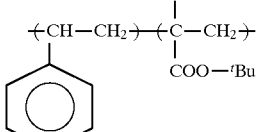 (xxi)

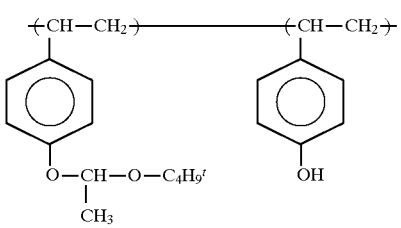 (xxii)

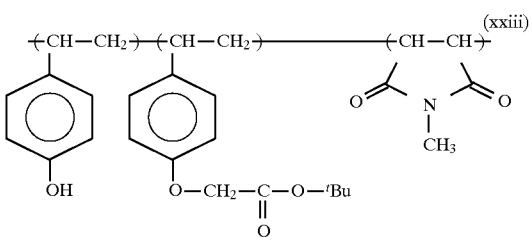 (xxiii)

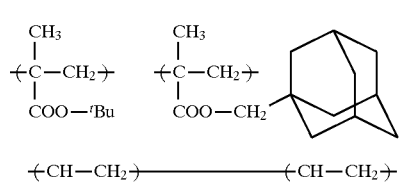 (xxiv)

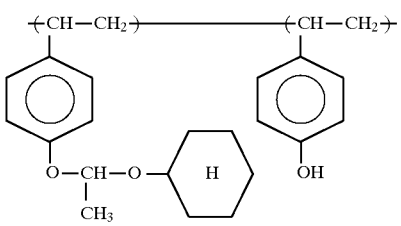 (xxv)

When the number of acid-decomposable groups contained in a resin is denoted by B and the number of alkali-soluble groups present in the resin which are protected by acid-decomposable groups is denoted by S, the content of acid-decomposable groups is represented by B/(B+S). The suitable content is from 0.01 to 0.5, preferably from 0.05 to 0.40, and more preferably from 0.05 to 0.30. The content range of greater than 0.5, B/(B+S)>0.5, is undesirable because the film shrinkage after PEB (Post Exposure Bake), poor adhesion to a substrate and scumming are generated. The content range of smaller than 0.01, B/(B+S)<0.01, is undesirable because stationary waves remain on the pattern side wall.

The weight average molecular weight (Mw) of the resin having acid-decomposable groups is preferably in the range of 2,000 to 200,000. When Mw is less than 2,000, the reduction of film thickness in the unexposed area by development becomes great; while, when Mw is more than 200,000, the dissolution rate of the resin itself in an alkali becomes slow to lower the sensitivity. It is thus preferred that the Mw of the resin be in the range of 5,000 to 100,000, especially 8,000 to 50,000. It is desirable for the resin to have the dispersion degree (Mw/Mn) of 1.0 to 4.0, preferably 1.0 to 2.0, particularly preferably 1.0 to 1.6. The smaller the dispersion degree of a resin is, the better heat resistance and image forming characteristics (pattern profile, defocus latitude, etc.) the resin can provide.

Therein, the weight average molecular weight is defined as the value determined by a polystyrene-converted value of gel permeation chromatography.

Further, the resins which have acid-decomposable groups may be used alone or as a mixture of two or more thereof. These resins are used in a proportion of from 40 to 99 weight %, preferably from 60 to 95 weight %, based on the total weight of the photosensitive composition (excepting a coating solvent). Furthermore, the resins may be used in the form of mixture with an alkali-soluble resin having no acid-decomposable group in order to control the solubility in an alkali.

Preferably, an acid-decomposable dissolution-inhibiting low molecular compound as described hereinafter is admixed with the aforementioned combination of the acid generator and the resin having acid-decomposable groups.

In such a case, the dissolution inhibiting compound is added in a proportion of from 3 to 45 weight %, preferably from 5 to 30 weight %, and more preferably from 10 to 20 weight %, based on the total weight of the photosensitive composition (excepting a coating solvent).

4. Alkali-Soluble Resins usable in the Invention

In the present invention, it is desirable to use resins which are insoluble in water but soluble in an aqueous alkali solution (simply called an alkali-soluble resins).

Specific examples of an alkali-soluble resins used in the present invention include a novolak resin, a hydrogenated novolak resin, an acetone-pyrogallol resin, poly(o-hydroxystyrene), poly(m-hydroxystyrene), poly(p-hydroxystyrene), hydrogenated polyhydroxystyrene, halogen- or alkyl-substituted polyhydroxystyrene, hydroxystyrene-N-substituted maleimide copolymers, o/p- and m/p-hydroxystyrene copolymers, polyhydroxystyrenes whose OH groups are partially alkylated [e.g., polyhydroxystyrene whose OH groups are methylated in a proportion of 5–30 mole %, polyhydroxystyrene whose OH groups are (1-methoxy)ethylated in a proportion of 5–30 mole %, polyhydroxystyrene whose OH groups are (1-ethoxy) ethylated in a proportion of 5–30 mole %, polyhydroxystyrene whose OH groups are 2-tetrahydropyranylated in a proportion of 5–30 mole %, polyhydroxystyrene whose OH groups are (t-butoxycarbonyl)methylated in a proportion of 5–30 mole %], polyhydroxystyrenes whose OH groups are partially acylated [e.g., polyhydroxystyrene whose OH groups are acetylated in a proportion of 5–30 mole %, polyhydroxystyrene whose OH groups are (t-butoxy) carbonylated in a proportion of 5–30 mol %], styrene-maleic anhydride copolymers, styrene-hydroxystyrene copolymers, α-methylstyrene-hydroxystyrene copolymers, carboxyl group-containing methacrylic resins and derivatives thereof, but these examples should not be construed as limiting on the scope of the present invention in any way.

Of those alkali-soluble resins, a novolak resin, poly(o-hydroxystyrene), poly(m-hydroxystyrene), poly(p-hydroxystyrene), copolymers of these hydroxystyrenes, alkyl-substituted polyhydroxystyrene, partially 0-alkylated or O-acylated polyhydroxystyrene, a styrene-hydroxystyrene copolymer and an α-methylstyrene-hydroxystyrene copolymer are preferred in particular. The novolak resin as described above can be obtained using specified monomers as main component and subjecting them to the addition condensation reaction with aldehydes in the presence of an acidic catalyst.

As the specified monomers, aromatic hydroxy compounds, such as phenol, cresols (e.g., m-cresol, p-cresol and o-cresol), xylenols (e.g., 2,5-xylenol, 3,5-xylenol, 3,4-xylenol and 2,3-xylenol), alkylphenols (e.g., m-ethylphenol, p-ethylphenol, o-ethylphenol, p-t-butylphenol, p-octylphenol and 2,3,5-trimethylphenol), alkoxyphenols (e.g., p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol and p-butoxyphenol), bisalkylphenols (e.g., 2-methyl-4-isopropylphenol), m-chlorophenol, p-chlorophenol, o-chlorophenol, dihydroxybiphenyl, bisphenol A, phenylphenol, resorcinol and naphthol, can be employed alone or as a mixture of two or more thereof. However, these examples should not be considered as limiting on the scope of the invention.

Specific examples of aldehydes which can be used in the present invention include formaldehyde, paraformaldehyde, acetaldehyde, propionaldehyde, benzaldehyde, phenylacetaldehyde, α-phenylpropyl aldehyde, β-phenylpropyl aldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, chloroacetaldehyde and acetal compounds thereof, such as chloroacetaldehyde diethylacetal. Of these aldehydes, formaldehyde is preferably used.

Those aldehydes can be used alone or as a mixture of two or more thereof. As the acidic catalyst which can be used in the present invention, hydrochloric acid, sulfuric acid, formic acid, acetic acid and oxalic acid can be preferably used.

It is desirable for the novolak resins obtained in the foregoing manner to have their weight average molecular weight of 1,000 to 30,000. When the weight average molecular weight is lower than 1,000, a decrease of film thickness due to development is too great in the unexposed area; while, when it is more than 30,000, the development speed becomes low. In particular, the range of 2,000 to 20,000 is desirable for the weight average molecular weight of a novolak resin used.

As the foregoing alkali-soluble resins other than novolak resins, such as polyhydroxystyrenes, the derivatives thereof and hydroxystyrene copolymers, it is desirable for their weight average molecular weight to be at least 2,000, preferably from 5,000 to 200,000, more preferably from 10,000 to 100,000. From the viewpoint of enhancing heat resistance of a resist film, it is advantageous for such the resin to have a weight average molecular weight of at least 25,000.

Additionally, the weight average molecular weight is defined as the value determined by a polystyrene-converted value of gel permeation chromatography.

Those alkali-soluble resins as described above may be used as a mixture of two or more thereof. The proportion of alkali-soluble resins used is from 40 to 97 weight %, preferably from 60 to 90 weight %, based on the total weight of the photosensitive composition (except a coating solvent).

5. Low Molecular Acid-decomposable Dissolution Inhibiting Compound used in the Invention In the present invention, it is preferable to use a low molecular acid-decomposable dissolution inhibiting compound.

The acid-decomposable dissolution inhibiting compound used in the present invention is a compound having such a structure that at least two acid-decomposable groups are present therein and at least 8 bonding atoms, except the atoms contained in the acid-decomposable groups, lie between the two acid-decomposable groups located most remotely from each other.

In particular, it is desirable for the acid-decomposable dissolution inhibiting compounds used in the present invention that at least two acid-decomposable groups be present therein and at least 10 bonding atoms, preferably at least 11 bonding atoms, more preferably at least 12 bonding atoms, except the atoms contained in the acid-decomposable groups, lie between the two acid-decomposable groups located most remotely from each other; or at least three acid-decomposable groups be present therein and at least 9 bonding atoms, preferably at least 10 bonding atoms, more preferably at least 11 bonding atoms, except the atoms contained in the acid-decomposable groups, lie between the two acid-decomposable groups located most remotely from each other. Further, the upper limit of the number of the aforesaid bonding atoms is preferably 50, more preferably 30.

When an acid-decomposable dissolution inhibiting compound has at least 3, preferably at least 4, acid-decomposable groups, and even when it has two acid-decomposable groups, its ability to inhibit the dissolution of an alkali-soluble resin is remarkably enhanced by locating those acid-decomposable groups at a certain definite distance or longer.

Additionally, the distance between acid-decomposable groups in the present invention is expressed in terms of the number of bonding atoms via which one acid-decomposable group is connected to the other acid-decomposable group. For instance, the distance between acid-decomposable groups in each of the following Compounds (1) and (2) is represented by 4 bonding atoms; while that in the following Compound (3) is represented by 12 bonding atoms:

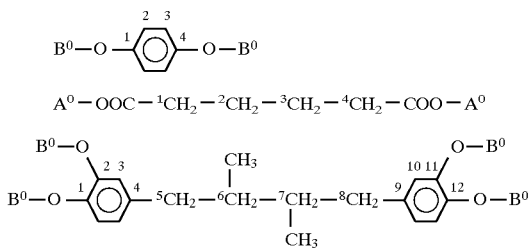

Acid-decomposable groups: —COO—$A^0$, —O—$B^0$

In addition, the acid-decomposable dissolution inhibiting compound used in the present invention may have two or more acid-decomposable groups on one benzene ring. However, the present invention prefers a compound having a skeleton in which each benzene ring has thereon one acid-decomposable group. Further, it is desirable for the acid-decomposable dissolution inhibiting compound used in the present invention to have a molecular weight of 3,000 or less, preferably from 500 to 3,000, more preferably from 1,000 to 2,500.

In preferred embodiments of the present invention, the moieties containing acid-decomposable groups of formula —COO—$A^0$ or —O—$B^0$ are those represented by formulae —$R^0$—COO—$A^0$ and —Ar—O—$B^0$, respectively.

Herein, $A^0$ represents a group of formula —C($R^{01}$)($R^{02}$)($R^{03}$), —Si($R^{01}$)($R^{02}$)($R^{03}$) or —C($R^{04}$)($R^{05}$)—O—$R^{06}$; and $B^0$ represents $A^0$ or —CO—O—$A^0$.

$R^{01}$, $R^{02}$, $R^{03}$, $R^{04}$ and $R^{05}$ may be the same or different, and each represents a hydrogen atom, an alkyl group, a cycloalkyl group, an alkenyl group or an aryl group; and $R^{06}$ represents an alkyl group or an aryl group: provided that at least two among $R^{01}$, $R^{02}$ and $R^{03}$ are groups other than a hydrogen atom. Further, two among $R^{01}$, $R^{02}$ and $R^{03}$ may combine with each other to complete a ring, and two among $R^{04}$, $R^{05}$ and $R^{06}$ may also combine with each other to complete a ring. $R^0$ represents an unsubstituted or substituted divalent aliphatic or aromatic hydrocarbon group, and —Ar— represents a monocyclic or polycyclic, unsubstituted or substituted, aromatic group having at least two valency.

Therein, suitable examples of an alkyl group include those containing 1 to 4 carbon atoms, such as a methyl group, an ethyl group, a propyl group, a n-butyl group, a sec-butyl group and a t-butyl group; suitable examples of a cycloalkyl group include those containing 3 to 10 carbon atoms, such as a cyclopropyl group, a cyclobutyl group, a cyclohexyl group and an adamantyl group; suitable examples of an alkenyl group include those containing 2 to 4 carbon atoms, such as a vinyl group, a propenyl group, an allyl group and a butenyl group; and suitable examples of an aryl group include those containing 6 to 14 carbon atoms, such as a phenyl group, a xylyl group, a toluyl group, a cumenyl group, a naphthyl group and an anthryl group.

Examples of a substituent for the groups as described above include a hydroxy group, halogen atoms (e.g, fluorine, chlorine, bromine, iodine), a nitro group, a cyano group, the alkyl groups as described above, alkoxy groups (e.g., methoxy, ethoxy, hydroxyethoxy, propoxy, hydroxypropoxy, n-butoxy, isobutoxy, sec-butoxy, t-butoxy), alkoxycarbonyl groups (e.g., methoxycarbonyl, ethoxycarbonyl), aralkyl groups (e.g., benzyl, phenetyl, cumyl), aralkyloxy groups, acyl groups (e.g., formyl, acetyl, butyryl, benzoyl, cinnamyl, valeryl), acyloxy groups (e.g., butyryloxy), the alkenyl groups as described above, alkenyloxy groups (e.g., vinyloxy, propenyloxy, allyloxy, butenyloxy), the aryl groups as described above, aryloxy groups (e.g., phenoxy), and aryloxycarbonyl groups (e.g., benzoyloxy).

Suitable examples of those acid-decomposable groups include a silyl ether group, a cumyl ester group, an acetal group, a tetrahydropyranyl ether group, an enol ether group, an enol ester group, a t-alkyl ether group, a t-alkyl ester group and a t-alkyl carbonate group. Of these groups, a t-alkyl ester group, a t-alkyl carbonate group, a cumyl ester group and a tetrahydropyranyl ether group are preferred over the others.

Examples of an acid-decomposable dissolution inhibiting compound which can be used in the present invention include the compounds obtained by bonding part or all of phenolic OH groups of the polyhydroxy compounds described below with the groups as described above, or —$R^0$—COO—$A^0$ or $B^0$ groups, to protect the OH groups. Examples of those polyhydroxy compounds include compounds described in JP-A-01-289946, JP-A-01-289947, JP-A-02-2560, JP-A-03-128959, JP-A-03-158855, JP-A-03-179353, JP-A-03-191351, JP-A-03-200251, JP-A-03-200252, JP-A-03-200253, JP-A-03-200254, JP-A-03-200255, JP-A-03-259149, JP-A-03-279958, JP-A-03-279959, JP-A-04-1650, JP-A-04-1651, JP-A-04-11260, JP-A-04-12356, JP-A-04-12357, and Japanese Patent Application Nos. 3-33229, 3-230790, 3-320438, 4-25157, 4-52732, 4-103215, 4-104542, 4-107885, 4-107889 and 4-152195 are specific examples thereof.

Of those acid-decomposable dissolution inhibiting compounds, those obtained by using the polyhydroxy compounds described in JP-A-01-289946, JP-A-03-128959, JP-A-03-158855, JB-A-03-179353, JP-A-03-200251, JP-A-03-200252, JP-A-03-200255, JP-A-03-259149, JP-A-03-279958, JP-A-04-1650, JP-A-04-11260, JP-A-04-12356, JP-A-04-12357, and Japanese Patent Application Nos. 4-25157, 4-103215, 4-104542, 4-107885, 4-107889 and 4-152195 are preferred.

More specifically, the compounds illustrated by the formulae [I] to [XVI] respectively are suitable examples of composable dissolution inhibiting compounds.
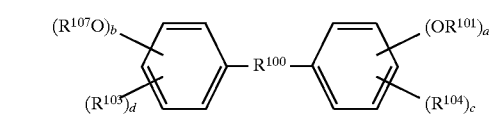
[I]
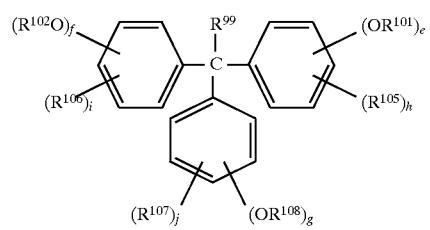
[II]
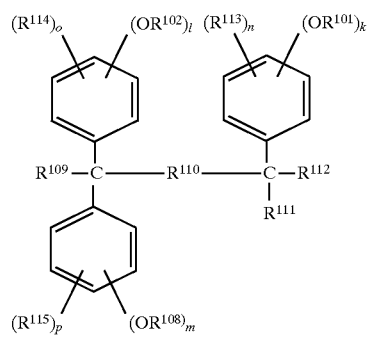
[III]
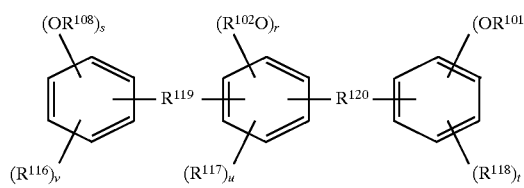
[IV]
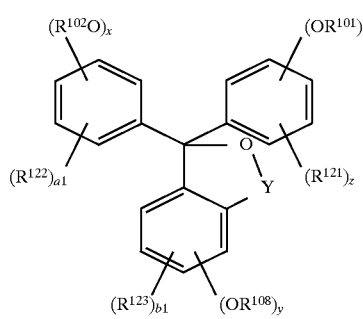
[V]
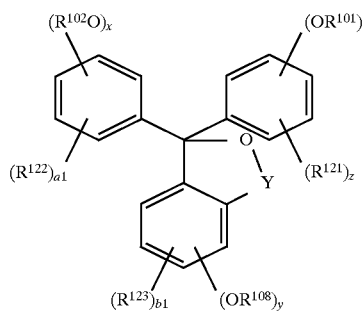
[VI]
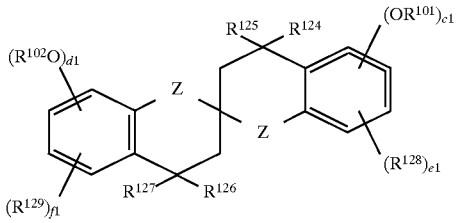
[VII]
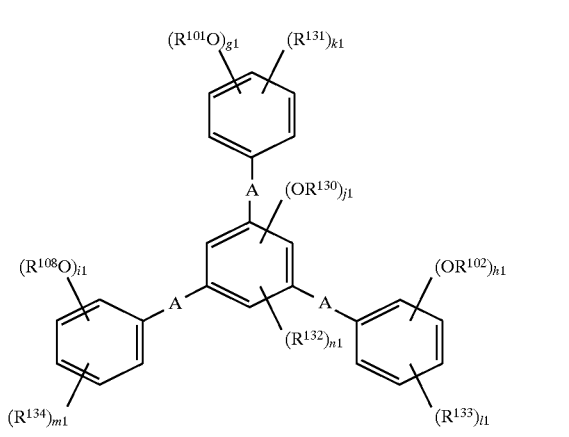
[VIII]
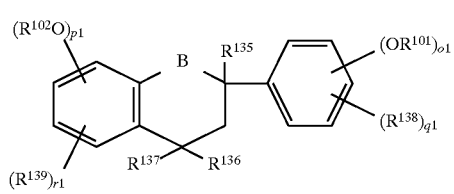
[IX]
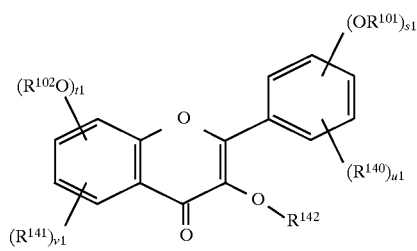
[X]
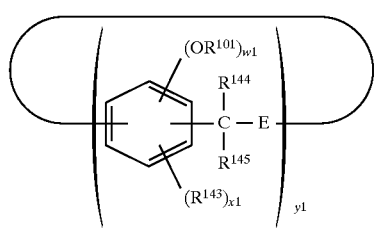
[XI]

[XII]

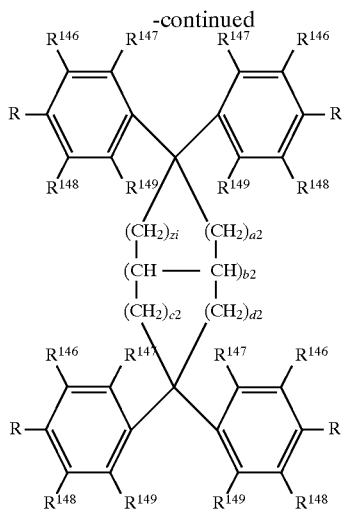

$R^{101}$ $R^{102}$, $R^{108}$ and $R^{130}$ may be the same or different, and each represents a hydrogen atom, —$R^0$—COO—C($R^{01}$)($R^{02}$)($R^{03}$) or —CO—O—C($R^{01}$)($R^{02}$)($R^{03}$), wherein $R^0$, $R^{01}$, $R^{02}$ and $R^{03}$ have the same meanings as defined hereinbefore, respectively.

$R^{100}$ represents —CO—, —COO—, —NHCONH—, —NHCOO—, —O—, —S—, —SO—, —SO$_2$—, —SO$_3$—, or

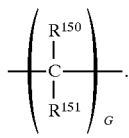

wherein G is from 2 to 6, provided that at least one of $R^{150}$ and $R^{151}$ is an alkyl group when G is 2; $R^{150}$ and $R^{151}$ may be the same or different, and each represents a hydrogen atom, an alkyl group, an alkoxy group, —OH, —COOH, —CN, a halogen atom, —$R^{152}$—COO$R^{153}$ or —$R^{154}$—OH; $R^{152}$ and $R^{154}$ each represents an alkylene group; and $R^{153}$ represents a hydrogen atom, an alkyl group, an aryl group or an aralkyl group.

$R^{99}$, $R^{103}$ to $R^{107}$, $R^{109}$, $R^{111}$ to $R^{118}$, $R^{121}$ to $R^{123}$, $R^{128}$, $R^{129}$, $R^{131}$ to $R^{134}$, $R^{138}$ to $R^{141}$, and $R^{143}$ may be the same or different, and each represents a hydrogen atom, a hydroxy group, an alkyl group, an alkoxy group, an acyl group, an acyloxy group, an aryl group, an aryloxy group, an aralkyl group, an aralkyloxy group, a halogen atom, a nitro group, a carboxyl group, a cyano group or —N($R^{155}$)($R^{156}$)($R^{155}$, $R^{156}$: H, an alkyl group or an aryl group).

$R^{110}$ represents a single bond, an alkylene group or

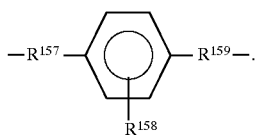

wherein $R^{157}$ and $R^{159}$ may be the same or different, and each represents a single bond, an alkylene group, —O—, —S—, —CO—or a carboxyl group; and $R^{158}$ represents a hydrogen atom, an alkyl group, an alkoxy group, an acyl group, an acyloxy group, an aryl group, a nitro group, a hydroxy group, a cyano group or a carboxyl group, wherein the hydroxy group may be replaced by an acid-decomposable group (such as t-butoxycarbonylmethyl, tetrahydropyranyl, 1-ethoxy-1-ethyl or 1-t-butoxy-1-ethyl).

$R^{119}$ and $R^{120}$ may be the same or different and each represents a methylene group, a lower alkyl-substituted methylene group, a halomethylene group or a haloalkylene group, wherein the lower alkyl group represents an alkyl group containing 1 to 4 carbon atoms.

$R^{124}$ to $R^{127}$ may be the same or different, and each represents a hydrogen atom or an alkyl group.

$R^{135}$ to $R^{137}$ may be the same or different, and each represents a hydrogen atom, an alkyl group, an alkoxy group, an acyl group or an acyloxy group.

$R^{142}$ represents a hydrogen atom, —R —COO—C($R^{01}$)($R^{02}$)($R^{03}$) —CO——O—C($R^{01}$)($R^{02}$)($R^{03}$), or the group of formula;

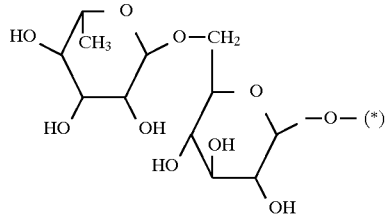

wherein the mark (*) means the site to which —O— is linked.

$R^{144}$ and $R^{145}$ may be the same or different, and each represents a hydrogen atom, a lower alkyl group, a lower haloalkyl group or an aryl group.

$R^{146}$ to $R^{149}$ may be the same or different, and each represents a hydrogen atom, a hydroxy group, a halogen atom, a nitro group, a cyano group, a carbonyl group, an alkyl group, an alkoxy group, an alkoxycarbonyl group, an aralkyl group, an aralkyloxy group, an acyl group, an acyloxy group, an alkenyl group, an alkenyloxy group, an aryl group, an aryloxy group or an aryloxycarbonyl group, wherein each set of four substituents denoted by the same symbol may not be the same as one another so far as they are included in the groups described above.

Y represents —CO— or —SO$_2$—.

Z and B each represents a single bond or —O—.

A represents a methylene group, a lower alkyl-substituted methylene group, a halomethylene group or a haloalkylene group.

E represents a single bond or an oxymethylene group.

When a to z and a1 to y1 are each two or more, parenthesized groups may be the same or different.

a to q, s, t v, g1 to i1, k1 to m1, o1, q1, s1, and u1 each represents 0 or an integer of 1 to 5;

r, u, w, x, y, z, a1 to f1, p1, r1, t1, and v1 to x1 each represents 0 or an integer of 1 to 4;

j1, n1, z1, a2, b2, c2 and d2 each represents 0 or an integer of 1 to 3; provided that at least one of z1, a2, c2 and d2 is 1 or more; and y1 represents an integer of 3 to 8: provided that a+b$\geq$2, e+f+g$\geq$2, k+l+m$\geq$2, q+r+s$\geq$2, w+x+y$\geq$2, c1+d1$\geq$2, g1+h1+i1+j1$\geq$2, o1+p1$\geq$2, s1+t1$\geq$2, j1+n1$\leq$3, r+u$\leq$4, w+z$\leq$4, x+a1$\leq$4, y+b1$\leq$4, c1+e1$\leq$4, d1+f1$\leq$4, p1+r1$\leq$4, t1+v1$\leq$4, x1+w1$\leq$4, but w+z$\leq$5 and x+a1$\leq$5 in the formula [V], a+c$\leq$5, b+d$\leq$5, e+h$\leq$5, f+i$\leq$5, g+j$\leq$5, k+n$\leq$5, l+o$\leq$5, m+p$\leq$5, q+t$\leq$5, s+v$\leq$5, g1+k1$\leq$5, h1+i1$\leq$5, i1+m1$\leq$5, o1+q1$\leq$5 and s1+u1$\leq$5.

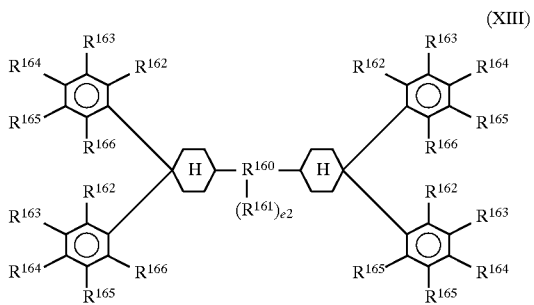

(XIII)

wherein $R^{160}$ represents an organic group, a single bond, —S—, —SO— or —SO$_2$; $R_{161}$ represents a hydrogen atom, a monovalent organic group, or a group of the following formula,

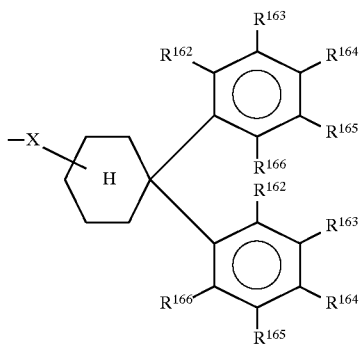

wherein X represents a divalent organic group; $R^{162}$ to $R^{166}$ may be the same or different, and each represents a hydrogen atom, a hydroxy group, a halogen atom, an alkyl group, an alkoxy group, an alkenyl group, —O—R$^0$—COO—C(R$^{01}$)(R$^{02}$)(R$^{03}$) or —O—CO—O—C(R$^{01}$)(R$^{02}$)(R$^{03}$), provided that at least two of them represents —O—R$^0$—COO—C(R$^{01}$)(R$^{02}$)(R$^{03}$) or —O—CO—O—C(R$^{01}$)(R$^{02}$)(R$^{03}$), but each set of four or six substituents denoted by the same symbol may not be the same group so far as they are included in the groups recited above; and e2 is 0 or 1.

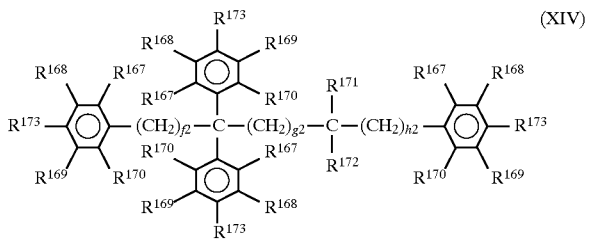

(XIV)

wherein $R^{167}$ to $R^{170}$ may be the same or different, and each represents a hydrogen atom, a hydroxy group, a halogen atom, an alkyl group, an alkoxy group or an alkenyl group, but each set of 4 or 6 substituents denoted by the same symbol may not be the same group so far as they are included in the groups recited above; $R^{171}$ and $R^{172}$ each represents a hydrogen atom, an alkyl group or a group of formula

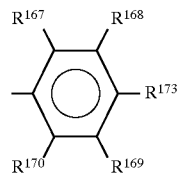

at least two of $R^{173}$ groups represents —O—R$^0$—COO—C(R$^{01}$)(R$^{02}$)(R$^{03}$) or —O—CO—O—C(R$^{01}$)(R$^{03}$)(R$^{03}$) and the rest of them represents hydroxy groups; f2 and h2 each represents 0 or 1; and g2 represents 0 or an integer of 1 to 4.

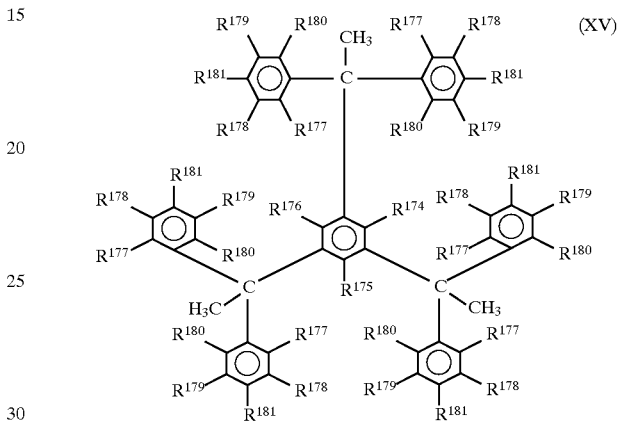

(XV)

wherein $R^{174}$ to $R^{180}$ may be the same or different, and each represents a hydrogen atom, a hydroxy group, a halogen atom, an alkyl group, an alkoxy group, a nitro group, an alkenyl group, an aryl group, an aralkyl group, an alkoxycarbonyl group, an arylcarbonyl group, an acyloxy group, an acyl group, an aralkyloxy group or an aryloxy group, and wherein each set of six substituents denoted by the same symbol may not be the same so far as they are included in the groups recited above; at least two of $R^{181}$ groups represents —O—R$^0$— COO—C(R$^{01}$)(R$^{02}$)(R$^{03}$) or —O—CO—O—C(R$^{01}$)(R$^{02}$)(R$^{03}$) and the rest of them represents hydroxy groups.

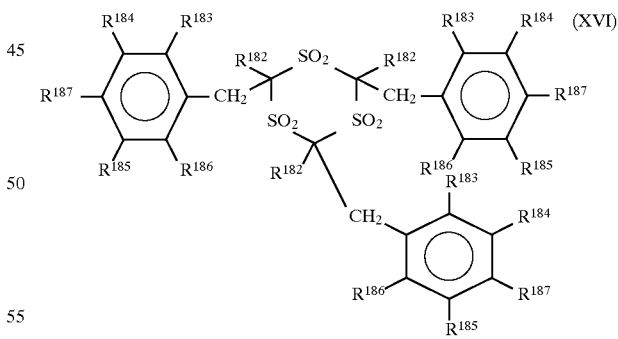

(XVI)

wherein the substituents denoted by $R^{182}$ each represents a hydrogen atom or an alkyl group, and all of them may not be the same; the substituents denoted by $R^{183}$ to $R^{186}$ each represents a hydroxy group, a hydrogen atom, a halogen atom, an alkyl group or an alkoxy group, but each set of three substituents denoted by the same symbol may not be the same so far as they are included in the groups recited above; and at least two of the substituents denoted by $R^{187}$ represents —O—R$^0$—COO—C(R$^{01}$)(R$^{03}$)(R$^{03}$) or —O—CO—O—C(R$^{01}$)(R$^{02}$)(R$^{03}$) and the rest of them represents hydroxy groups.

Specific examples of a suitable compound skeleton are illustrated below, wherein the mark (*) means the site to which —O— is linked:
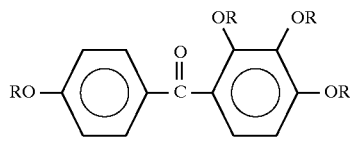
(1)
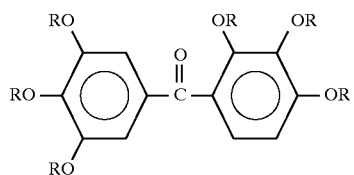
(2)
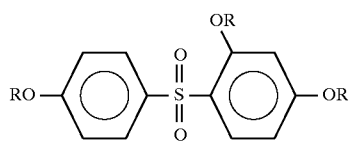
(3)
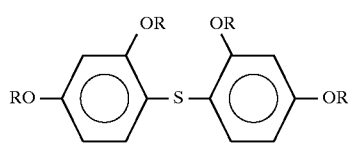
(4)
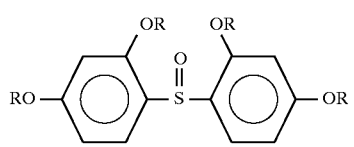
(5)
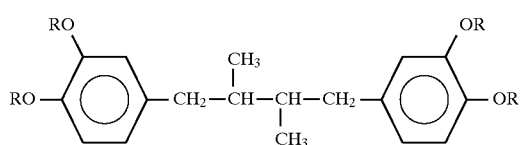
(6)
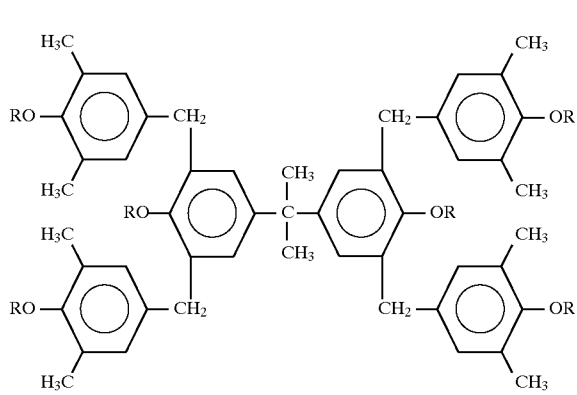
(7)
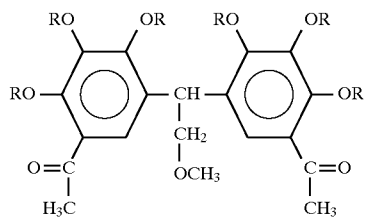
(8)

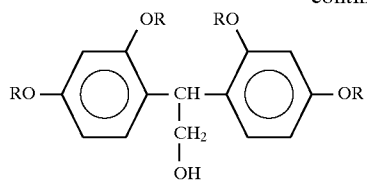
(9)
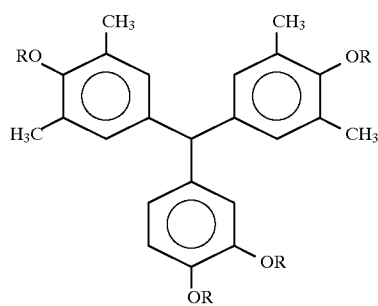
(10)
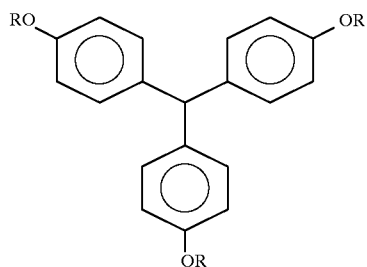
(11)
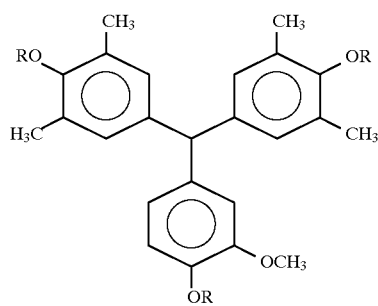
(12)
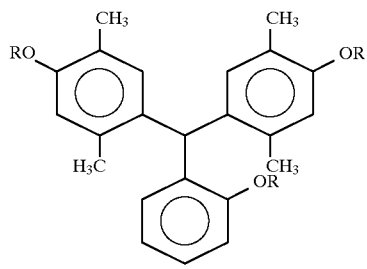
(13)
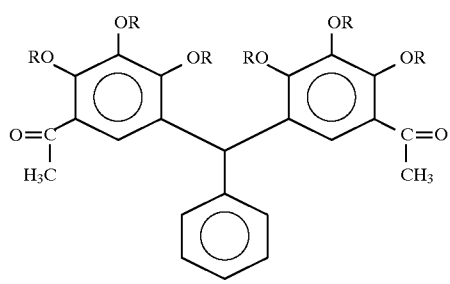
(14)

-continued
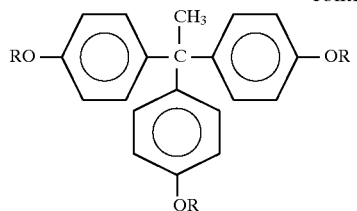
(15)
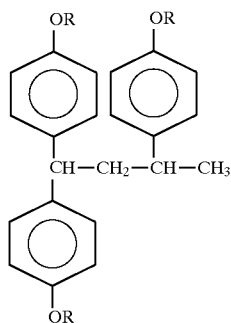
(16)
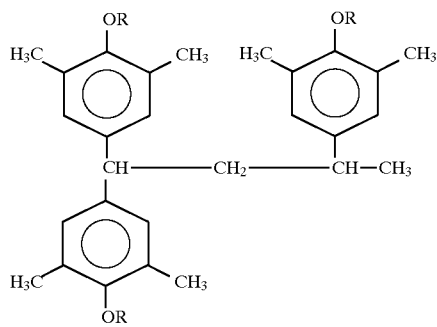
(17)
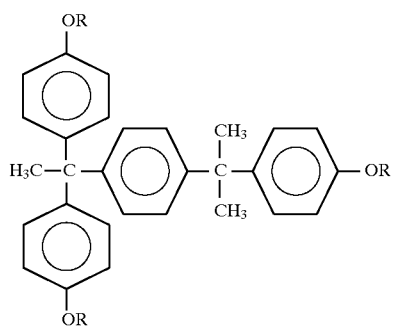
(18)
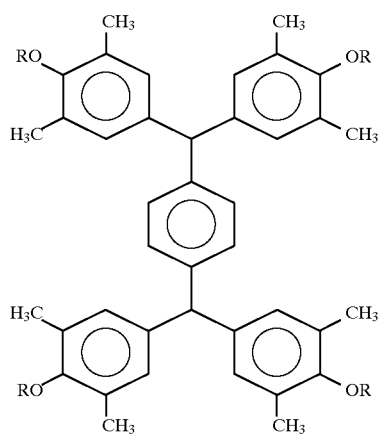
(19)

-continued
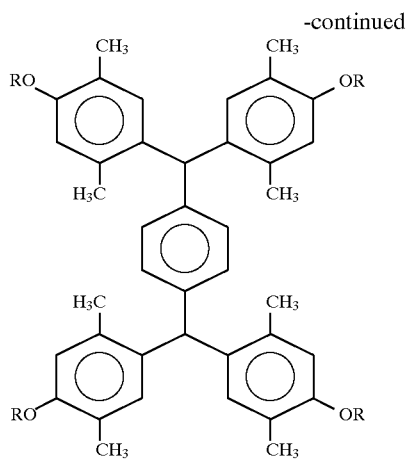 (20)
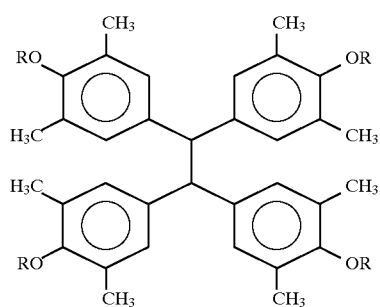 (21)
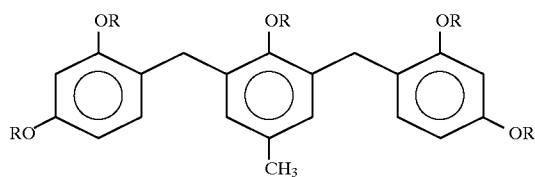 (22)
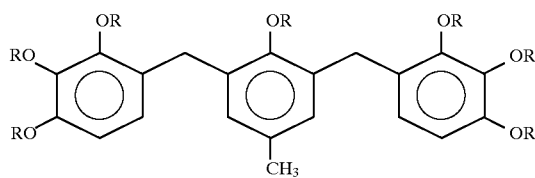 (23)
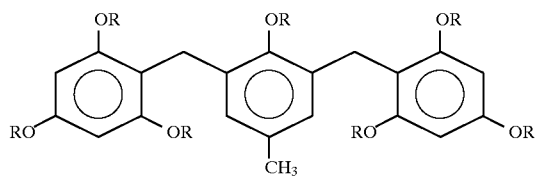 (24)
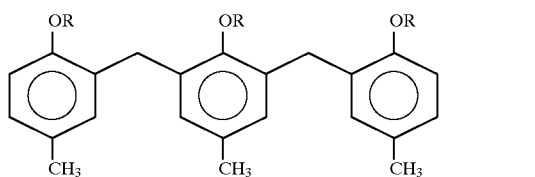 (25)
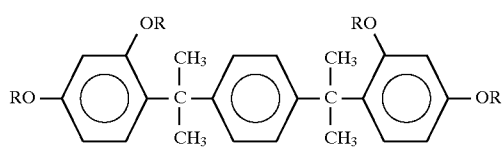 (26)

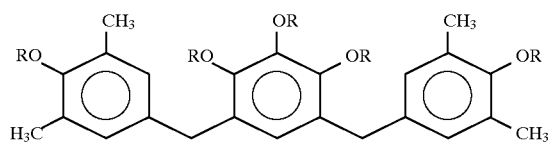
(27)
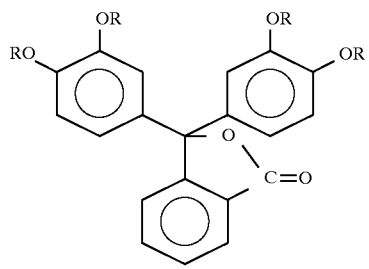
(28)
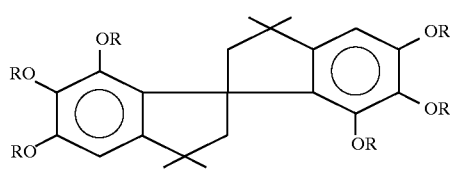
(29)
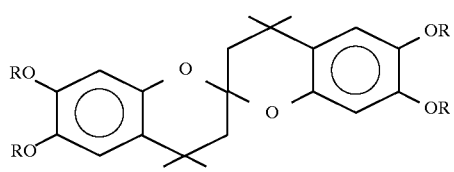
(30)
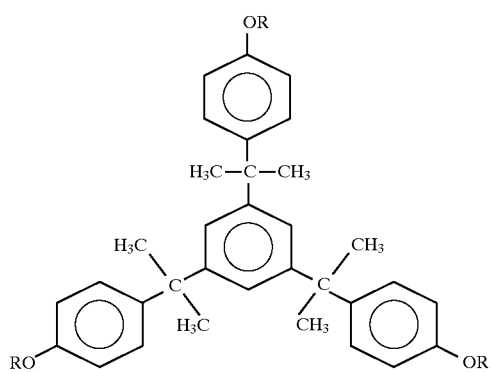
(31)
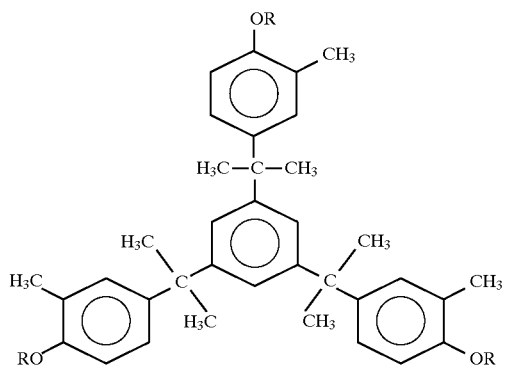
(32)

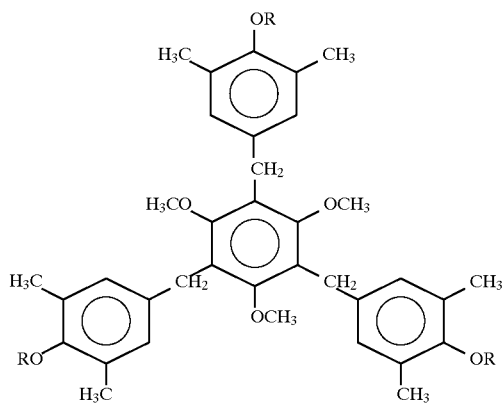
(33)
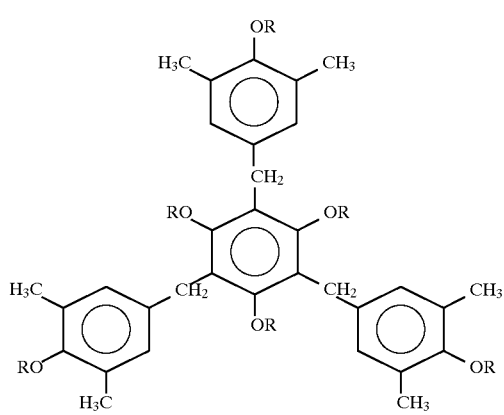
(34)
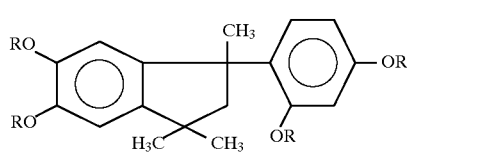
(35)
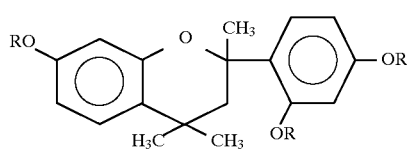
(36)
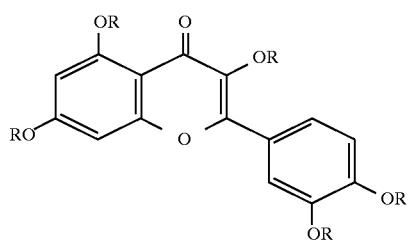
(37)
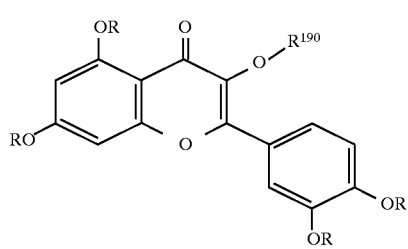
(38)

-continued
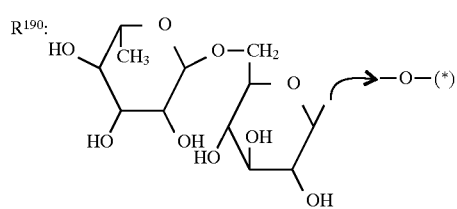
(39)
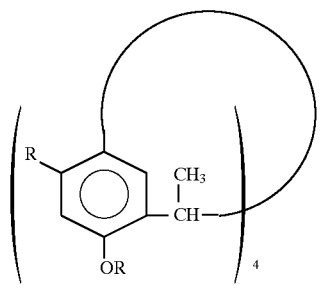
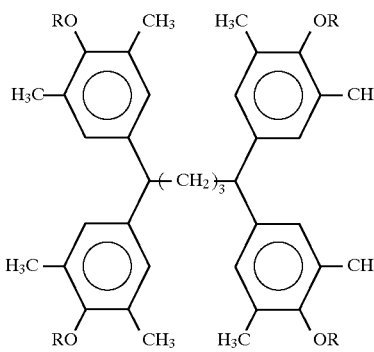
(40)
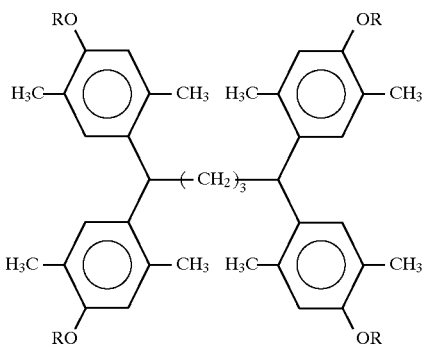
(41)
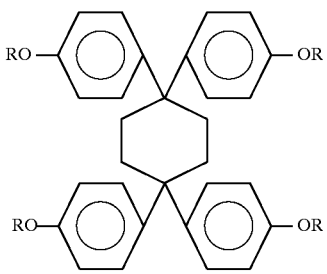
(42)

-continued
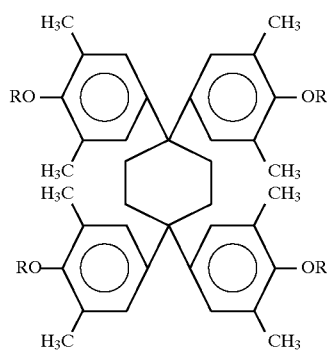
(43)
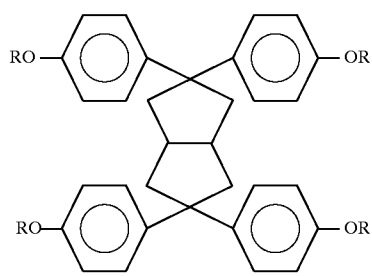
(44)
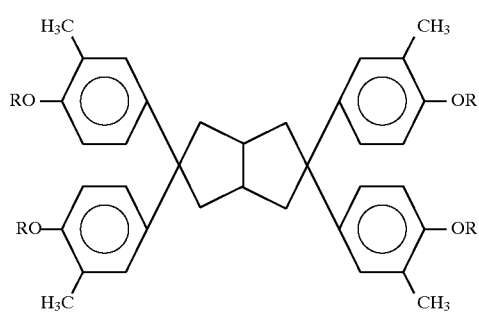
(45)
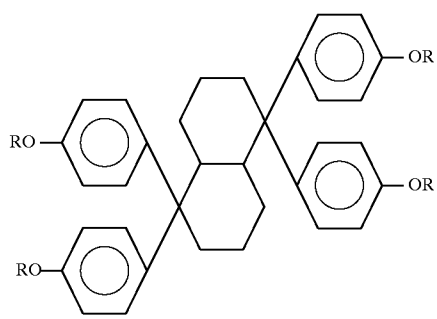
(46)
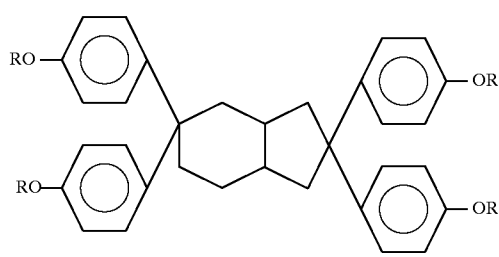
(47)

-continued
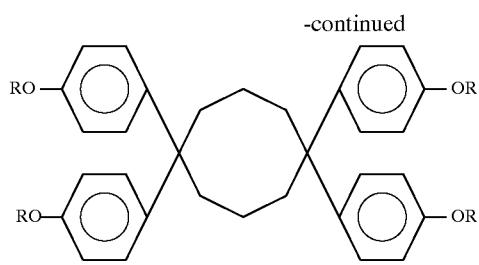
(48)
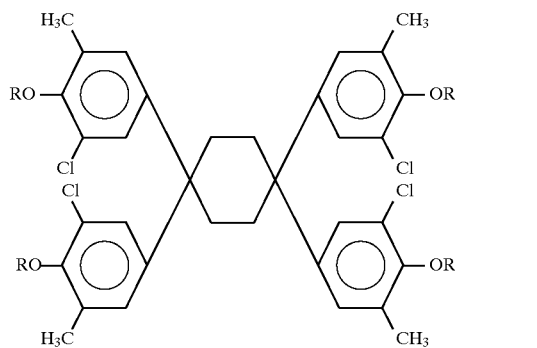
(49)
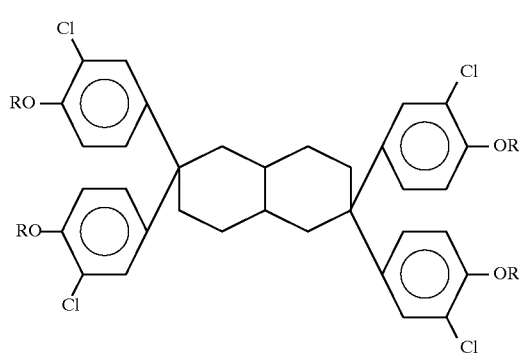
(50)
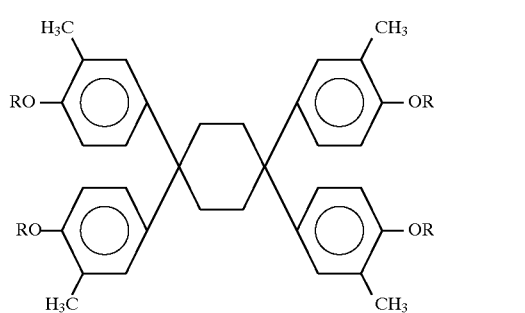
(51)
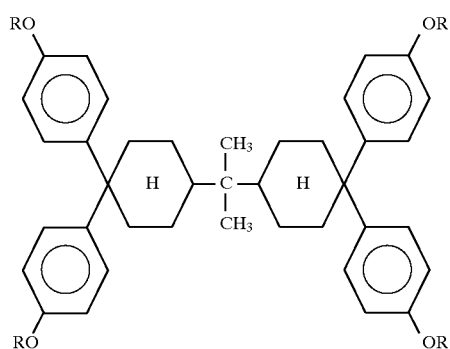
(52)

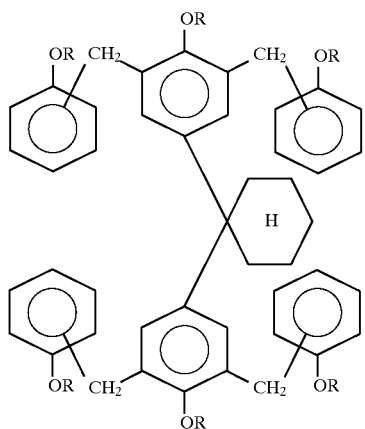
(53)
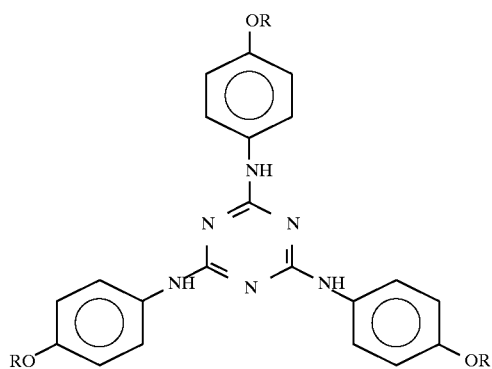
(54)
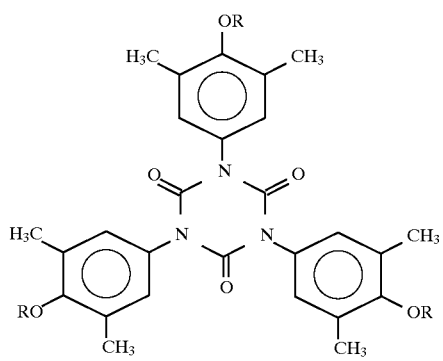
(55)
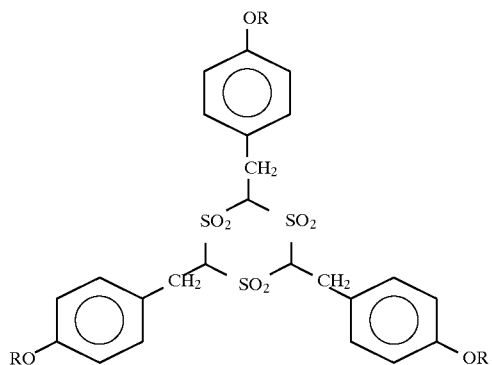
(56)

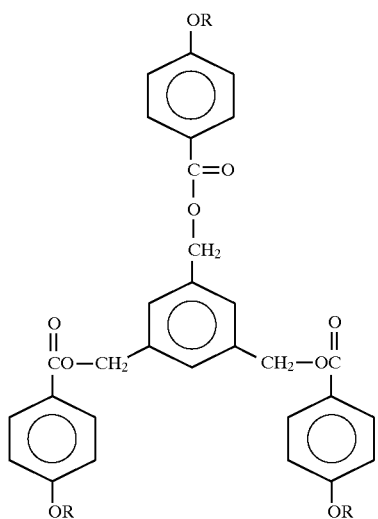
(57)
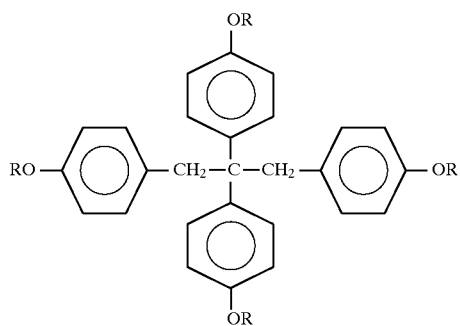
(58)
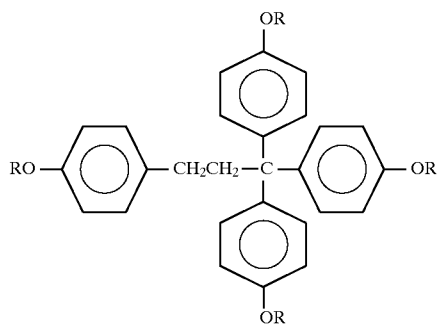
(59)
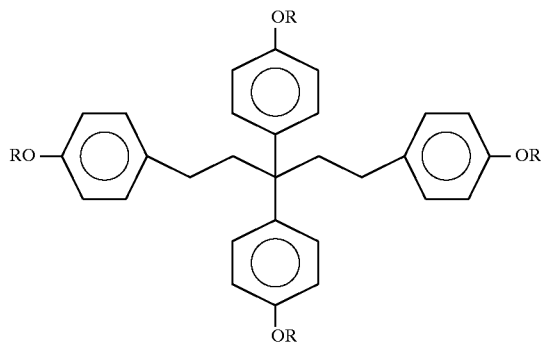
(60)

-continued

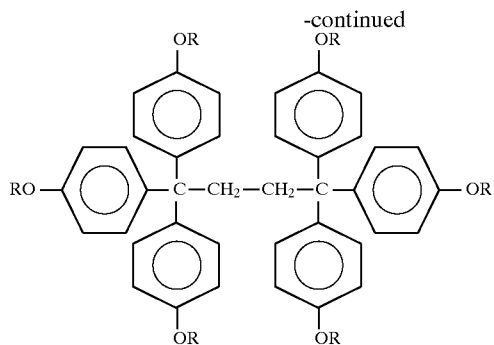

(61)

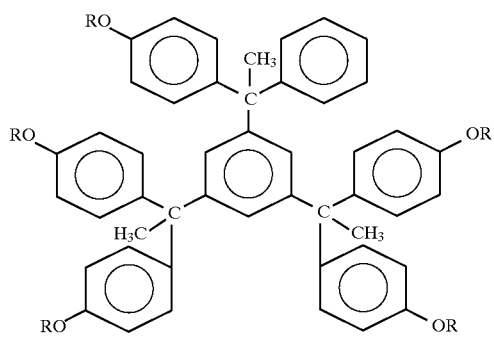

(62)

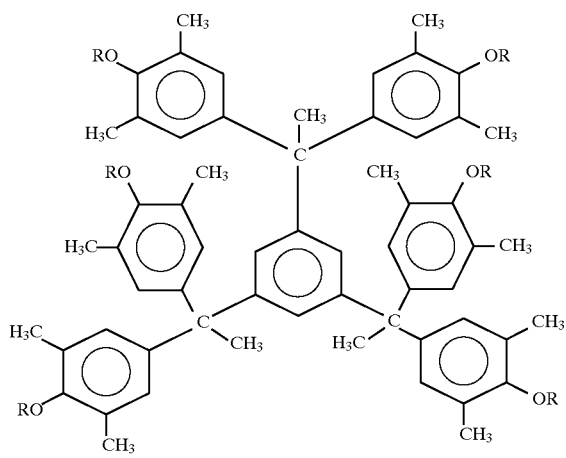

(63)

R groups in each of Compounds (1) to (63) represents a hydrogen atom, —CH$_2$—COO—C(CH$_3$)$_2$C$_6$H$_5$, —CH$_2$—COO—C$_4$H$_9$(t), —COO—C$_4$H$_9$(t) or

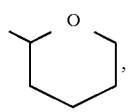

provided that at least two of the R groups, or three of them depending on the structural condition, are groups other than hydrogen atom. The substituents represented by R, other than hydrogen, may not be the same group so far as they are included in the groups described above.

When the foregoing acid-decomposable dissolution inhibiting compound is used in combination with an acid generating compound and an alkali-soluble resin, the proportion thereof is from 3 to 50 weight %, preferably from 5 to 40 weight %, more preferably from 10 to 35 weight %, based on the total weight of the photosensitive composition (except a coating solvent).

6. Other Ingredients used in the Invention

The photosensitive composition of the present invention can further contain a dye, a pigment, a plasticizer, a surfactant, a photosensitizer, an organic basic compound and a compound having at least two phenolic OH groups to promote dissolubility in a developer, if needed.

For the compound having at least two phenolic OH groups which can be used in the present invention, it is desirable to be a phenolic compound having a molecular weight of no higher than 1,000. Such the phenolic compound is required to have at least two phenolic OH groups in the molecule, but it loses its effect on improvement in development latitude when the number of phenolic OH groups contained therein is more than 10. Further, when the ratio between phenolic OH groups and aromatic ring(s) is less than 0.5 in the phenolic compound, the film thickness dependence shows an increasing tendency and the development latitude shows a narrowing tendency. In addition, it is also undesirable that the foregoing ratio is greater than 1.4, because the photosensitive composition containing such the phenolic compound undergoes deterioration in stability to make it difficult to achieve high resolution and satisfactory film thickness dependence.

For the phenolic compounds usable in the present invention, it is desirable to be added in a proportion of 2 to 50 weight %, preferably 5 to 30 weight %, to an alkali-soluble resin used together. The addition thereof in a proportion of higher than 50 weight % is undesirable because it aggravates development-residue trouble and newly causes pattern deformation upon development.

Those phenolic compounds having molecular weight of 1,000 or less can be prepared with ease by reference to the methods described in, e.g., JP-A-04-122938, JP-A-02-28531, U.S. Pat. No. 4,916,210 and European Patent 0,219,294.

Specific examples of such the phenolic compound as mentioned above include the compounds described below, but these examples are not to be considered as limiting on the scope of compounds usable in the present invention.

Specifically, examples of the phenolic compounds include resorcin, phloroglucin, 2,3,4-trihydroxybenzophenone, 2,3,4,4'-tetrahydroxybenzophenone, 2,3,4,3',4',5'-hexahydroxybenzophenone, acetone-pyrogallol condensed resin, 2,4,2',4'-biphenyltetra-ol, 4,4'-thiobis(1,3-dihydroxy) benzene, 2,2',4,4'-tetrahydroxydiphenyl ether, 2,2',4,4'-tetrahydroxydiphenyl sulfoxide, 2,2',4,4'-tetrahydroxydiphenyl sulfone, tris(4-hydroxyphenyl) methane, 1,1-bis(4-hydroxyphenyl)cyclohexane, 4,4'-(α-methyl-benzylidene)bisphenol, α,α',α"-tris(4-hydroxyphenyl)-1,3,5-triisopropylbenzene, α,α',α"-tris(4-hydroxyphenyl)-1-ethyl-4-isopropylbenzene, 1,2,2-tris (hydroxyphenyl)propane, 1,1,2-tris(3,5-dimethyl-4-hydroxyphenyl)propane, 2,2,5,5-tetrakis(4-hydroxyphenyl) hexane, ,1,2,2-tetrakis(4-hydroxyphenyl)ethane, 1,1,3-tris (hydroxyphenyl)butane and para[α,α,α',α'-tetrakis(4-hydroxyphenyl)]xylene.

The organic basic compounds which can be appropriately used in the present invention are compounds having stronger basicity than phenol. Of those compounds, nitrogen-containing basic compounds are preferred.

As examples of a desirable chemical environment of nitrogen atom(s) in such a basic compound, mention may be made of the structures represented by formulae (A) to (E):

wherein $R^{250}$, $R^{251}$ and $R^{252}$ may be the same or different, and each represents a hydrogen atom, an alkyl group containing 1 to 6 carbon atoms, an aminoalkyl group containing 1 to 6 carbon atoms, a hydroxyalkyl group containing 1 to 6 carbon atoms or a substituted or unsubstituted aryl group containing 6 to 20 carbon atoms;

wherein $R^{253}$ $R^{254}$ $R^{255}$ and $R^{256}$ may be the same or different, and each represents an alkyl group containing 1 to 6 carbon atoms. $R^{254}$ and $R^{255}$ may combine with each other to form a ring.

More appropriate nitrogen-containing basic compounds are those containing in a molecule at least two nitrogen atoms different in chemical environment. In particular, compounds having in a molecule both a substituted or unsubstituted amino group and a ring structure containing nitrogen atom(s) or compounds having alkylamino groups are preferred. The concrete examples of an organic basic compound in the present invention include a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine, and a substituted or unsubstituted aminoalkylmorpholine. Examples of substituents suitable for the compounds as described above include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group. Examples of specifically prerably basic compounds include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperadine, N-(2-aminoethyl) piperadine, N-(2-aminoethyl)piperidine, 4-amino-2, 2,6,6-tetramethylpiperidine, 4-piperizinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine. However, basic compounds usable in the present invention should not be construed as being limited to the compounds recited above.

Those nitrogen-containing basic compounds can be used alone or as a mixture of two or more thereof. The amount of nitrogen-containing basic compound(s) used is generally from 0.001 to 10 parts by weight, preferably from 0.01 to 5 parts by weight, per 100 parts by weight of the photosensitive composition (except a solvent). When such the compounds are added in an amount of less than 0.001 part by weight, they cannot bring about their effect; while, when the addition amount thereof is more than 10 parts by weight, they tend to lower the sensitivity and deteriorate the developability in unexposed areas.

As suitable dyes, oily dyes and basic dyes are used. Specific examples of the dyes include Oil Yellow #101, Oil Yellow #103, Oil Pink #312, Oil Green BG, Oil Blue BOS, Oil Blue #603, Oil Black BY, Oil Black BS, Oil Black T-505 (which are products by Orient Kagaku Kogyo Co., Ltd.), Crystal Violet (CI42555), Methyl Violet (CI42535), Rhodamine B (CI45170B), Malachite Green (CI42000) and Methylene Blue (CI52015).

Further, the spectral sensitizers as described below are added for sensitizing to the wavelengths at which the photoacid generator used has no spectral absorption, that is, wavelengths longer than far ultraviolet region, and thereby it becomes possible to sensitize to i- or g-line upon the present photosensitive composition. Specific examples of such the spectral sensitizer include benzophenone, p,p'- tetramethyldiaminobenzophenone, p,p'-tetraethylethylaminobenzophenone, 2-chlorothioxanthone, anthrone, 9-ethoxyanthracene, anthracene, pyrene, perylene, phenothiazine, benzil, Acridine Orange, benzoflavin, Cetoflavin-T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonyl-bis(5,7-dimethoxycarbonylcoumarin) and coronene, but these examples should not be construed as limiting on the scope of spectral sensitizers usable in the invention.

In addition, those spectral sensitizers can be used as an absorbent for far ultraviolet rays of a light source. Such absorbents can reduce the reflected light from a substrate to lessen the influence of multiple reflection inside the resist film; as a result, an effect on stationary wave improvement can be produced.

The ingredients mentioned above are dissolved in a solvent to prepare the present photosensitive composition, and coated on a support. Suitable examples of a solvent used therein include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethylacetate, ethylene glycol monoethylether acetate, propylene glycol monomethyl ether, propylene glycol monomethylether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran. These solvents are used alone or as a mixture of two or more thereof.

Also, a surfactant may be added to the solvent as described above. Specific examples of such the surfactant include nonionic surfactants, such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkyl aryl ethers (e.g., polyoxyethylene octyl phenyl ether, polyoxyethylene nonyl phenyl ether), polyoxyethylene-polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate) and polyoxyethylenesorbitan fatty acid esters (e.g., polyoxyethylenesorbitan monolaurate, polyoxyethylenesorbitan monopalmitate, polyoxyethylenesorbitan monostearate, polyoxyethylenesorbitan trioleate, polyoxyethylenesorbitan tristearate); fluorine-containing surfactants, such as Eftop EF301, EF303 and EF352 (commercial names, products of Shin-Akita Kasei K.K.), Megafac F171 and F173 (commercial names, products of Dai-Nippon Ink & Chemicals, Inc.), Florade FC430 and FC431 (commercial names, products of Sumitomo 3M Co., Ltd.), Asahi Guard AG710, Surflon S-382, SC101, SC102, SC103, SC104, SC105 and SC106 (commercial names, products of Asahi Glass Company, Ltd.); organosiloxane polymers, such as KP341 (code name of Shinetsu Chemical Co., Ltd.), and acrylic or methacrylic acid (co)polymers, such as Polyflow No. 75 and No. 95 (commercial names, products of Kyoeisha Yushi Kagaku Kogyo K.K.). The amount of those surfactants added is generally not greater than 2 parts by weight, preferably not greater than 1 part by weight, per 100 parts by weight of the total solids in the composition of the present invention.

Those surfactants may be added alone or as a mixture of two or more thereof.

The aforementioned photosensitive composition is coated on a substrate as used for the production of precise integrated circuit elements (e.g., a silicon/silicon dioxide coating) with an appropriate coating means, e.g., a spinner, a coater or so on, exposed to light via a given mask, baked and then developed, thereby providing a satisfactory resist pattern.

Examples of the developer usable for the present photosensitive composition include an alkaline aqueous solution containing an inorganic alkali such as sodium hydroxide, potassium hydroxide, sodium carbonate, sodium silicate, sodium metasilicate or aqueous ammonia; a primary amine such as ethylamine or n-propylamine; a secondary amine such as diethylamine or di-n-butylamine; a tertiary amine such as triethylamine or methyldiethylamine; an alcohol amine such as dimethylethanolamine or triethanolamine; a quaternary ammonium slat such as tetramethylammonium hydroxide or tetraethylammonium hydroxide; or a cyclic amine such as pyrrole or piperidine. To such the alkaline aqueous solution, an alcohol and a surfactant can be added in appropriate amounts.

EXAMPLE

The present invention will be illustrated below in more detail by the following examples, but the scope of the invention should not be construed as being limited by these examples.

Synthesis Example 1

A 45% water solution of triphenylsulfonium chloride in an amount of 19.9 g (0.030 mole) was dissolved in 200 ml of ion-exchange purified water. To this solution, a solution containing 8.4 g (0.030 mole) of sodium 3-butoxycarbonylbenzenesulfonate in 400 ml of ion-exchange purified water was added at room temperature with stirring.

The thus deposited viscoelastic solid was separated by decantation, and washed with 1 liter of ion-exchange purified water. The viscoelastic solid obtained was dissolved in 100 ml of acetone, and poured into 500 ml of ion-exchange purified water with stirring to recrystallize. The obtained recrystallized product was dried at 50° C. under vacuum to give 14.2 g of a glassy solid. This solid was confirmed to be Compound (I-2) of the present invention by NMR measurement.

Synthesis Example 2

In the same manner as in Synthesis Example 1, except that 8.9 g (0.030 mole) of sodium 3,5-bis(methoxycarbonyl) benzenesulfonate was used in place of 8.4 (0.030 mole) g of sodium 3-butoxycarbonylbenzenesulfonate, a glassy solid was obtained in an amount of 14.8 g. This solid was confirmed to be Compound (I-12) of the present invention by NMR measurement.

Synthesis Example 3

In the same manner as in Synthesis Example 1, except that 9.5 g (0.030 mole) of sodium 3-methoxycarbonyl-4-methoxynaphthalenesulfonate was used in place of 8.4 g (0.030 mole) of sodium 3-butoxycarbonylbenzenesulfonate, a glassy solid was obtained in an amount of 15.1 g. This solid was confirmed to be Compound (I-29) of the present invention by NMR measurement.

Synthesis Example 4

Diphenyliodonium chloride in an amount of 9.5 g (0.030 mole) was dissolved in 200 ml of ion-exchange purified water. To this solution, a solution containing 8.9 g (0.030 mole) of sodium 3,5-bis(methoxycarbonyl)benzenesulfonate in 400 ml of ion-exchange purified water was added at room temperature with stirring. The thus deposited viscoelastic solid was separated by decantation, and washed with 1 liter of ion-exchange purified water.

The viscoelastic solid obtained was dissolved in 100 ml of acetone, and poured into 500 ml of ion-exchange purified water with stirring to recrystallize. The obtained recrystallized product was dried at 50° C. under vacuum to give 15.2 g of a glassy solid. This solid was confirmed to be Compound (II-13) of the present invention by NMR measurement.

Synthesis Example 5

In the same manner as in Synthesis Example 4, except that 10.4 g (0.030 mole) of sodium 4,5-bis(methoxycarbonyl)naphthalenesulfonate was used in place of 8.9 g (0.030 mole) of sodium 3,5-bis(methoxycarbonyl)benzenesulfonate, a glassy solid was obtained in an amount of 15.7 g. This solid was confirmed to be Compound (II-26) of the present invention by NMR measurement.

Synthesis Example 6

4,4'-Bis(t-butylphenyl)iodonium chloride in an amount of 12.9 g (0.030 mole) was dissolved in 400 ml of ion-exchange purified water. To this solution, a solution containing 12.4 g (0.030 mole) of sodium 9,10-dimethoxy-7-ethoxycarbonyl-2-anthracenesulfonate in 400 ml of ion-exchange purified water was added at room temperature with stirring. The thus deposited viscoelastic solid was separated by decantation, and washed with 1 liter of ion-exchange purified water.

The viscoelastic solid obtained was dissolved in 100 ml of acetone, and poured into 500 ml of ion-exchange purified water with stirring to recrystallize. The obtained recrystallized product was dried at 50° C. under vacuum to give 20.5 g of a powder. This solid was confirmed to be Compound (II-35) of the present invention by NMR measurement.

The other sulfonium and iodonium compounds of the present invention were synthesized in the manners similar to the above, respectively.

Dissolution Inhibiting Compound Synthesis I

To a solution containing 20 g of $\alpha,\alpha',\alpha''$-tris(4-hydroxyphenyl)-1,3,5-triisopropylbenzene in 400 ml of tetrahydrofuran, 14 g of potassium tert-butoxide was added in an atmosphere of nitrogen, and stirred for 10 minutes at room temperature. Then, 29.2 g of di-tert-butyldicarbonate was further added thereto. In the resulting solution, the reaction was run for 3 hours at room temperature. The reaction mixture thus obtained was poured into ice-cold water, followed by extraction of the reaction product with ethyl acetate. Further, the ethyl acetate phase was washed with water, dried and then distilled to remove the solvent. The crystalline solid obtained was recrystallized from diethyl ether, and dried. Thus, 25.6 g of Compound Example 31 (all R groups=t-BOC groups) was obtained.

Dissolution Inhibiting Compound Synthesis II

To a solution containing 20 g of $\alpha,\alpha',\alpha''$-tris(4-hydroxyphenyl)-1,3,5-triisopropylbenzene in 400 ml of diethyl ether, 31.6 g of 3,4-dihydro-2H-pyran and a catalytic amount of hydrochloric acid were added in an atmosphere of nitrogen, and the reaction was carried out therein for 24 hours under reflux. At the conclusion of the reaction, the resultant solution was admixed with a small amount of sodium hydroxide and filtered. The solvent was distilled away from the filtrate, and the product obtained was purified by column chromatography, and dried. Thus, Compound Example 31 (all R groups=THP groups) was obtained.

Dissolution Inhibiting Compound Synthesis III

To a solution containing 19.2 g (0.040 mole) of $\alpha,\alpha',\alpha''$-tris(4-hydroxyphenyl)-1,3,5-triisopropylbenzene in 120 ml of N,N-dimethylacetamide were added 21.2 g (0.15 mole) of potassium carbonate and 27.1 g (0.14 mole ) of t-butyl bromoacetate. The resulting solution was stirred for 7 hours at 120° C. The reaction mixture obtained was poured into 1.5 l of water, and then extracted with ethyl acetate. After drying with magnesium sulfate, the extract obtained was concentrated, and purified by column chromatography (carrier: silica gel, developing solvent: ethyl acetate/n-hexane (3/7 by volume) mixture). Thus, 30 g of light yellow viscoelastic solid was obtained. This solid was confirmed to be Compound Example 31 (all R groups=—$CH_2COOC_4H_9$ (t)) by NMR measurement.

Dissolution Inhibiting Compound Synthesis IV

1-[$\alpha$-Methyl-$\alpha$-(4'-hydroxyphenyl)ethyl]-4-[$\alpha',\alpha'$-bis(4"-hydroxyphenyl)ethyl]benzene in an amount of 42.4 g (0.10 mole) was dissolved in 300 ml of N,N-dimethylacetamide, and thereto 49.5 g (0.35 mole) of potassium carbonate and 84.8 g (0.33 mole) of cumyl bromoacetate were added. The resulting solution was stirred for 7 hours at 120° C. The reaction mixture obtained was poured into 2 l of ion-exchange purified water, neutralized with acetic acid, and then extracted with ethyl acetate. The extract obtained was concentrated, and purified in the same manner as in the above Synthesis III. Thus, 70 g of Compound Example 18 (all R groups=—$CH_2COOC(CH_3)_2C_6H_5$ groups) was obtained.

Dissolution Inhibiting Compound Synthesis V

To a solution containing 14.3 g (0.020 mole) of $\alpha,\alpha,\alpha',\alpha',\alpha'',\alpha''$-hexakis(4-hydroxyphenyl)-1,3,5-triethylbenzene in 120 ml of N,N-dimethylacetamide, 21.2 g (0.15 mole) of potassium carbonate and further 27.1 g (0.14 mole ) of t-butyl bromoacetate were added. The resulting solution was stirred for 7 hours at 120° C. The reaction mixture obtained was poured into 1.5 l of water, and then extracted with ethyl acetate. After drying with magnesium sulfate, the extract obtained was concentrated, and purified by column chromatography (carrier: silica gel, developing solvent: ethyl acetate/n-hexane (2/8 by volume) mixture). Thus, 24 g of light yellow powder was obtained. This yellow powder was confirmed to be Compound Example 62 (all R groups=—$CH_2$—COO—$C_4H_9$(t) groups) by NMR measurement.

Dissolution Inhibiting Compound Synthesis VI

To a solution containing 20 g (0.042 mole) of $\alpha,\alpha',\alpha''$-tris(4-hydroxyphenyl)-1,3,5-triisopropylbenzene in 400 ml of tetrahydrofuran (THF), 9.3 g (0.083 mole) of potassium tert-butoxide was added in an atmosphere of nitrogen, and stirred for 10 minutes at room temperature. Then, 19.5 g (0.087 mole) of di-tert-butyldicarbonate was further added thereto. In the resulting solution, the reaction was run for 3 hours at room temperature, and the reaction mixture obtained was poured into ice-cold water, followed by extraction of the reaction product with ethyl acetate.

The extract obtained was concentrated, and isolated and purified by column chromatography (carrier: silica gel, developing solvent: ethyl acetate/n-hexane (1/5 by volume)

mixture). Thus, 7 g of Compound Example 31 (two R groups=t-BOC groups; one R group=hydrogen atom) was obtained.

Dissolution Inhibiting Compound Synthesis VII

To a solution containing 48.1 g (0.10 mole) of α,α',α"-tris(4-hydroxyphenyl)-1,3,5-triisopropylbenzene in 300 ml of dimethylacetamide, 22.1 g (0.16 mole) of potassium carbonate and 42.9 g (0.22 mole) of t-butyl bromoacetate were added thereto. The resulting solution was stirred for 5 hours at 120° C. The reaction mixture obtained was poured into 2 l of ion-exchange purified water, neutralized with acetic acid, and then extracted with ethyl acetate.

The extract obtained was concentrated, and isolated and purified by column chromatography (carrier: silica gel, developing solvent: ethyl acetate/n-hexane (1/5 by volume) mixture). Thus, 10 g of Compound Example 31 (two R groups=—$CH_2$—COO—$C_4H_9$(t) groups; one R group=hydrogen atom) was obtained.

EXAMPLE 1

The compounds of the present invention synthesized in the manners described in the foregoing Synthesis Examples were examined for their solubilities in the following solvents. The results of solubility examinations, including those of comparative compounds, are shown in Table 1.

Additionally, the solubility of each compound was evaluated by visual observation on the aspect assumed when 0.2 g of the compound was dissolved in 10 ml of each solvent.

TABLE 1

| | Solubilities in Solvents | | |
|---|---|---|---|
| Compound examined | Acetone | Solvent used PGMEA | EL/EEP (7/3) |
| Compound (I-2) | G | G | G |
| Compound (I-12) | G | G | G |
| Compound (I-22) | G | G | G |
| Compound (I-29) | G | G | G |

TABLE 1-continued

| | Solubilities in Solvents | | |
|---|---|---|---|
| Compound examined | Acetone | Solvent used PGMEA | EL/EEP (7/3) |
| Compound (I-42) | G | G | G |
| Compound (II-2) | G | G | G |
| Compound (II-13) | G | G | G |
| Compound (II-23) | G | G | G |
| Compound (II-26) | G | G | G |
| Compound (II-35) | G | G | G |
| Comparative Compound (A) | M | B | B |
| Comparative Compound (B) | M | B | B |

In the marks in Table 1, G means that the compound examined was dissolved in the solvent used, M means that the compound examined was partly dissolved in the solvent used, and B means that the compound examined was not dissolved in the solvent used.

In the solvents used, PGMEA represents methoxypropyl 2-acetate, EL represents ethyl lactate, and EEP represents ethyl 3-ethoxypropionate.

Comparative Compound (A) was triphenylsulfonium p-toluenesulfonate, and Comparative Compound (B) was diphenyliodonium p-toluenesulfonate.

As is apparent from Table 1, the photoacid generators of the present invention had excellent solubilities in the solvents used.

EXAMPLES 2 TO 16 AND COMPARATIVE EXAMPLES 1 TO 3

Preparation of Photosensitive Compositions

By the use of the compounds of the present invention obtained in the foregoing Synthesis Examples, photosensitive compositions were prepared in accordance with the formulae shown in Table 2.

TABLE 2

| | Formulae of Photosensitive Compositions | | | | | | |
|---|---|---|---|---|---|---|---|
| | Photoacid generator | Amount added | Resin | Amount added | Additives (Dissolution inhibitor, Alkali-soluble resin) | | Acid-decomposable group |
| Example 2 | Compound (I-2) | 0.10 g | PHS/EES | 1.90 g | — | | — |
| Example 3 | Compound (II-13) | 0.10 g | PHS/EES | 1.90 g | — | | — |
| Example 4 | Compound (I-12) | 0.10 g | PHS/THPS | 1.90 g | — | | — |
| Example 5 | Compound (II-2) | 0.10 g | PHS/THPS | 1.90 g | — | | — |
| Example 6 | Compound (I-12) | 0.10 g | PHS/BES | 1.90 g | — | | — |
| Example 7 | Compound (II-13) | 0.10 g | PHS/BES | 1.90 g | — | | — |
| Example 8 | Compound (I-22) | 0.10 g | PHS/TBOMS | 1.60 g | Dissolution inhibitor (7) | 0.30 g | EE |
| Example 9 | Compound (II-23) | 0.10 g | PHS/THPS | 1.60 g | Dissolution inhibitor (16) | 0.30 g | TBE |
| Example 10 | Compound (I-29) | 0.10 g | PHS/EES | 1.60 g | Dissolution inhibitor (31) | 0.30 g | TBOC |
| Example 11 | Compound (II-26) | 0.10 g | PHS/TBOMS | 1.60 g | Dissolution inhibitor (18) | 0.30 g | THP |
| Example 12 | Compound (I-42) | 0.10 g | PHS/TBOMS | 1.60 g | Dissolution inhibitor (41) | 0.30 g | EE |
| Example 13 | Compound (I-22) | 0.10 g | PHS/THPSS | 1.20 g | Dissolution inhibitor (18) PHS/AcST | 0.30 g 0.40 g | THP |
| Example 14 | Compound (II-35) | 0.10 g | — | — | Dissolution inhibitor (60) PHS/St | 0.50 g 1.40 g | THP |

TABLE 2-continued

Formulae of Photosensitive Compositions

| | Photoacid generator | Amount added | Resin | Amount added | Additives (Dissolution inhibitor, Alkali-soluble resin) | | Acid-decomposable group |
|---|---|---|---|---|---|---|---|
| Example 15 | Compound (I-44) | 0.10 g | — | | Dissolution inhibitor (62) | 0.50 g | THP |
| | | | | | PHS/St | 1.40 g | |
| Example 16 | Compound (I-36) | 0.10 g | — | | Dissolution inhibitor (60) | 0.50 g | EE |
| | | | | | PHS/OHS | 1.40 g | |
| Comparative Example 1 | Comparative Compound (C) | 0.10 g | PHS/EES | 1.90 g | — | | — |
| Comparative Example 2 | Comparative Compound (C) | 0.10 g | PHS/THPS | 1.60 g | Dissolution inhibitor (16) | 0.30 g | TBE |
| Comparative Example 3 | Comparative Compound (C) | 0.10 g | — | | Dissolution inhibitor (62) | 0.50 g | THP |
| | | | | | PHS/St | 1.40 g | |

The abbreviations used in Table 2 are as follows:

<Resins>

PHS/EES p-hydroxystyrene/p-(1-ethoxyethoxy)styrene (70/30 by mole) copolymer (weight average molecular weight: 21,000)

PHS/BES p-hydroxystyrene/p-(1-t-butoxyethoxy)styrene (70/30 by mole) copolymer (weight average molecular weight: 22,000)

PHS/TBOMS p-hydroxystyrene/t-butoxycarbonylmethoxystyrene (80/20 by mole) copolymer (weight average molecular weight: 20,000)

PHS/THPS p-hydroxystyrene/p-(2-tetrahydropyranyloxy)styrene (70/30 by mole) copolymer (weight average molecular weight: 22,000)

PHS/St p-hydroxystyrene/styrene (85/15 by mole) copolymer (weight average molecular weight: 35,000)

PHS/AcST p-hydroxystyrene/p-acetoxystyrene (80/20 by mole) copolymer (weight average molecular weight: 20,000)

PHS/OHS p-hydroxystyrene/o-hydroxystyrene (80/20 by mole) copolymer (weight average molecular weight: 32,000)

<Acid-decomposable group in dissolution inhibitor>

TBOC: —O—COO—$C_4H_9^t$

TBE: —O—$CH_2$—COO—$C_4H_9^t$

THP: 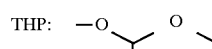

EE: 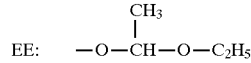

<Comparative Compound (C)>

Triphenylsulfonium trifluoromethanesulfonate

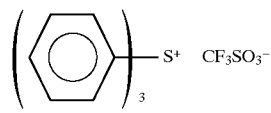

Evaluation of Photosensitive Compositions

Each of the photosensitive compositions shown in Table 2 was admixed with 0.02 g of 4-dimethylaminopyridine, dissolved in 9.5 g of propylene glycol monomethylether acetate, and then passed through a 0.2 μm filter, thereby preparing a resist solution. This resist solution was coated on a silicon wafer by means of a spin coater, and dried for 90 seconds at 110° C. on a hot plate of vacuum adsorption type, thereby forming a 0.83 μm-thick resist film.

Each of the thus formed resist films was exposed by means of a 248 nm KrF excimer laser stepper (NA=0.42). Immediately after the exposure, each resist film was heated for 60 seconds with a 100° C. hot plate of vacuum adsorption type, followed at once by 60-second dipping in a 2.38% water solution of tetramethylammonium hydroxide (TMAH). Further, it was rinsed with water for 30 seconds, and then dried. The patterns thus formed on the silicon wafer were examined for profile, sensitivity and resolution, and evaluated by the following criteria. With respect to these characteristics, comparison was made between the present and comparative photosensitive compositions. The results obtained are shown in Table 3.

[Profile]

The shape of each pattern on the silicon wafer was observed under a scanning electron microscope, and thereby the resist profile was evaluated.

[Sensitivity]

The sensitivity was defined as the exposure amount required for the reproduction of a 0.40 μm mask pattern.

[Resolution]

The resolution was represented by the limiting resolution under the exposure amount required for the reproduction of a 0.40 μm mask pattern.

On the other hand, another piece of each resist film exposed in the aforementioned manner was allowed to stand for 2 hours, and then heated under the same condition as described above. Further, it was dipped in a 2.38% water solution of tetramethylammonium hydroxide (TMAH) for 60 seconds, rinsed with water for 30 seconds, and then dried. The line width of the thus formed 0.35 μm mask pattern was measured, and a rate of line-width change due to difference between heat treatments performed immediately after exposure and after a 2-hour lapse from exposure was calculated. The results obtained are also shown in Table 3.

TABLE 3

| | Sensitivity (mJ/cm$^2$) | Resolution (μm) | Resist Pattern Profile | Rate of Line-width Change due to lapse of time before heating |
|---|---|---|---|---|
| Example 2 | 23 | 0.30 | rectangle | G |
| Example 3 | 24 | 0.30 | rectangle | G |
| Example 4 | 24 | 0.30 | rectangle | G |
| Example 5 | 22 | 0.30 | rectangle | M |
| Example 6 | 24 | 0.30 | rectangle | G |
| Example 7 | 23 | 0.30 | rectangle | G |
| Example 8 | 25 | 0.30 | rectangle | G |
| Example 9 | 24 | 0.30 | rectangle | M |
| Example 10 | 23 | 0.30 | rectangle | G |
| Example 11 | 25 | 0.30 | rectangle | G |
| Example 12 | 22 | 0.30 | rectangle | G |
| Example 13 | 21 | 0.30 | rectangle | M |
| Example 14 | 25 | 0.30 | rectangle | G |
| Example 15 | 25 | 0.30 | rectangle | G |
| Example 16 | 20 | 0.30 | rectangle | G |
| Comparative Example 1 | 24 | 0.30 | rectangle | B |
| Comparative Example 2 | 23 | 0.30 | rectangle | B |
| Comparative Example 3 | 23 | 0.30 | rectangle | B |

In the marks in Table 3, G means that a rate of line-width change (thinning) was within the range of 0 to 7%, M means that a rate of line-width change was within the range of 8 to 14%, and B means that a rate of line-width change was not lower than 15%.

It is clearly seen from the results shown in Table 3 that the resist films using the present positive working photosensitive compositions form resist patterns having satisfactory profile, high sensitivity and high resolution, and what is more, the resist patterns formed therein suffered a small change in line width due to lapse of time after exposure, as compared with the those formed in the resist films of Comparative Examples 1 to 3.

EFFECT OF THE INVENTION

The positive working photosensitive compositions according to the present invention can provide positive working photosensitive compositions of chemical amplification type which form resist patterns having satisfactory profile, high sensitivity, high resolution, and slight change in properties with a lapse of time after exposure.

While the invention has been described in detail and with reference to specific embodiments thereof, it will be apparent to one skilled in the art that various changes and modifications can be made therein without departing from the spirit and scope thereof.

What is claimed is:

1. A positive working photosensitive composition comprising (a) a resin having groups capable of increasing solubility of the resin in an alkali developer through their decomposition due to the action of an acid and (b) a compound represented by formula (I) or (II) generating a sulfonic acid by irradiation with active rays or radiant rays:

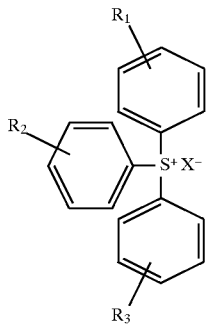

wherein $R_1$, $R_2$, $R_3$, $R_4$ and $R_5$ each represent a hydrogen atom, an alkyl group, a cycloalkyl group, an alkoxy group, a hydroxy group, a halogen atom or a —S—$R_6$ group; $R_6$ represents an alkyl group or an aryl group; and $X^-$ represents a benzenesulfonic, naphthalenesulfonic or anthracenesulfonic acid anion having at least one ester group.

2. The positive working photosensitive composition as in claim 1, further comprising (c) a low molecular weight, acid-decomposable, dissolution-inhibiting compound having a molecular weight of no greater than 3,000, having a group capable of being decomposed by an acid and increasing solubility of the resin in an alkali developer due to the action of the acid.

3. The positive working photosensitive composition as in claim 2, further comprising (d) a resin which is insoluble in water but soluble in an aqueous alkali solution.

4. The positive working photosensitive composition as in claim 1, further comprising (d) a resin which is insoluble in water but soluble in an aqueous alkali solution.

5. A positive working photosensitive composition comprising (b) a compound represented by formula (I) or (II) generating a sulfonic acid by irradiation with active rays or radiant rays, (c) a low molecular weight, acid-decomposable, dissolution-inhibiting compound having a molecular weight of no greater than 3,000, having a group capable of being decomposed by an acid and increasing solubility of the resin in an alkali developer due to the action of the acid and (d) a resin which is insoluble in water but soluble in an aqueous alkali solution:

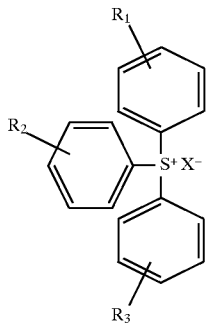

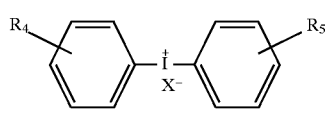
(II)
wherein $R_1$, $R_2$, $R_3$, $R_4$ and $R_5$ each represent a hydrogen atom, an alkyl group, a cycloalkyl group, an alkoxy group, a hydroxy group, a halogen atom or a —S—$R_6$ group; $R_6$ represents an alkyl group or an aryl group; and $X^-$ represents a benzenesulfonic, naphthalenesulfonic or anthracene-sulfonic acid anion having at least one ester group.
* * * * *